United States Patent
Yang et al.

(10) Patent No.: US 12,199,193 B2
(45) Date of Patent: Jan. 14, 2025

(54) FinFET MOS CAPACITOR

(71) Applicant: Taiwan Semiconductor Manufacturing Company, Ltd., Hsin-Chu (TW)

(72) Inventors: Sung-Hsin Yang, Tainan (TW); Jung-Chi Jeng, Tainan (TW); Ru-Shang Hsiao, Jhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 82 days.

(21) Appl. No.: 17/868,923

(22) Filed: Jul. 20, 2022

(65) Prior Publication Data
US 2022/0376121 A1    Nov. 24, 2022

Related U.S. Application Data

(62) Division of application No. 17/159,289, filed on Jan. 27, 2021, now Pat. No. 11,469,335.

(51) Int. Cl.
*H01L 29/94* (2006.01)
*H01L 27/06* (2006.01)
(Continued)

(52) U.S. Cl.
CPC .......... *H01L 29/94* (2013.01); *H01L 27/0629* (2013.01); *H01L 29/66181* (2013.01); *H01L 29/7851* (2013.01)

(58) Field of Classification Search
CPC ..... H01L 29/92–945; H01L 29/66174–66189; H01L 29/1037; H01L 29/66795; H01L 29/66803; H01L 29/6681; H01L 29/66818; H01L 29/785; H01L 29/7851; H01L 29/7853; H01L 29/7854; H01L 29/7855; H01L 29/7856; H01L 21/823431; H01L 21/823821; H01L 21/845; H01L 27/0629; H01L 27/0886; H01L 27/0924; H01L 27/10826;
(Continued)

(56) References Cited

U.S. PATENT DOCUMENTS 9,520,392 B1 * 12/2016 Cheng ................. H01L 21/3083
2009/0108316 A1    4/2009 Xiong et al.
(Continued)

OTHER PUBLICATIONS

Non-Final Office Action dated Nov. 16, 2021 for U.S. Appl. No. 17/159,289.
(Continued)

*Primary Examiner* — Yu Chen
(74) *Attorney, Agent, or Firm* — Eschweiler & Potashnik, LLC

(57) ABSTRACT

Various embodiments of the present disclosure are directed towards a FinFET MOS capacitor. In some embodiments, the FinFET MOS capacitor comprises a substrate and a capacitor fin structure extending upwardly from an upper surface of the substrate. The capacitor fin structure comprises a pair of dummy source/drain regions separated by a dummy channel region and a capacitor gate structure straddling on the capacitor fin structure. The capacitor gate structure is separated from the capacitor fin structure by a capacitor gate dielectric.

20 Claims, 19 Drawing Sheets

(51) Int. Cl.
*H01L 27/088* (2006.01)
*H01L 29/66* (2006.01)
*H01L 29/78* (2006.01)

(58) Field of Classification Search
CPC ........... H01L 27/10879; H01L 27/1211; H01L 2029/7857; H01L 2029/7858; H01L 28/90–92
See application file for complete search history.

(56) References Cited

U.S. PATENT DOCUMENTS

| | | |
|---|---|---|
| 2016/0149057 A1 | 5/2016 | Yoo et al. |
| 2017/0154686 A1 | 6/2017 | Liaw et al. |
| 2017/0317073 A1 | 11/2017 | Tsai et al. |
| 2018/0083046 A1 | 3/2018 | Cheng et al. |
| 2018/0122797 A1 | 5/2018 | Bi et al. |
| 2020/0105747 A1 | 4/2020 | Lee et al. |
| 2020/0235249 A1 | 7/2020 | Kar et al. |

OTHER PUBLICATIONS

Final Office Action dated Apr. 4, 2022 for U.S. Appl. No. 17/159,289.
Notice of Allowance dated Jun. 10, 2022 for U.S. Appl. No. 17/159,289.

* cited by examiner

FinFET MOS CAPACITOR

REFERENCE TO RELATED APPLICATION

This Application is a Divisional of U.S. application Ser. No. 17/159,289, filed on Jan. 27, 2021, the contents of which are hereby incorporated by reference in their entirety.

BACKGROUND

The semiconductor industry continues to improve the integration density of various electronic devices (e.g., transistors, diodes, resistors, capacitors, etc.) by, for example, reducing minimum feature sizes and/or arranging electronic devices closer to one another, which allows more components to be integrated into a given area. For example, a multi-transistor device may comprise more than one fin field effect transistor (FinFET), wherein a first gate electrode and a second gate electrode may be arranged over a same continuous fin to reduce device area and/or to increase manufacturing efficiency.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
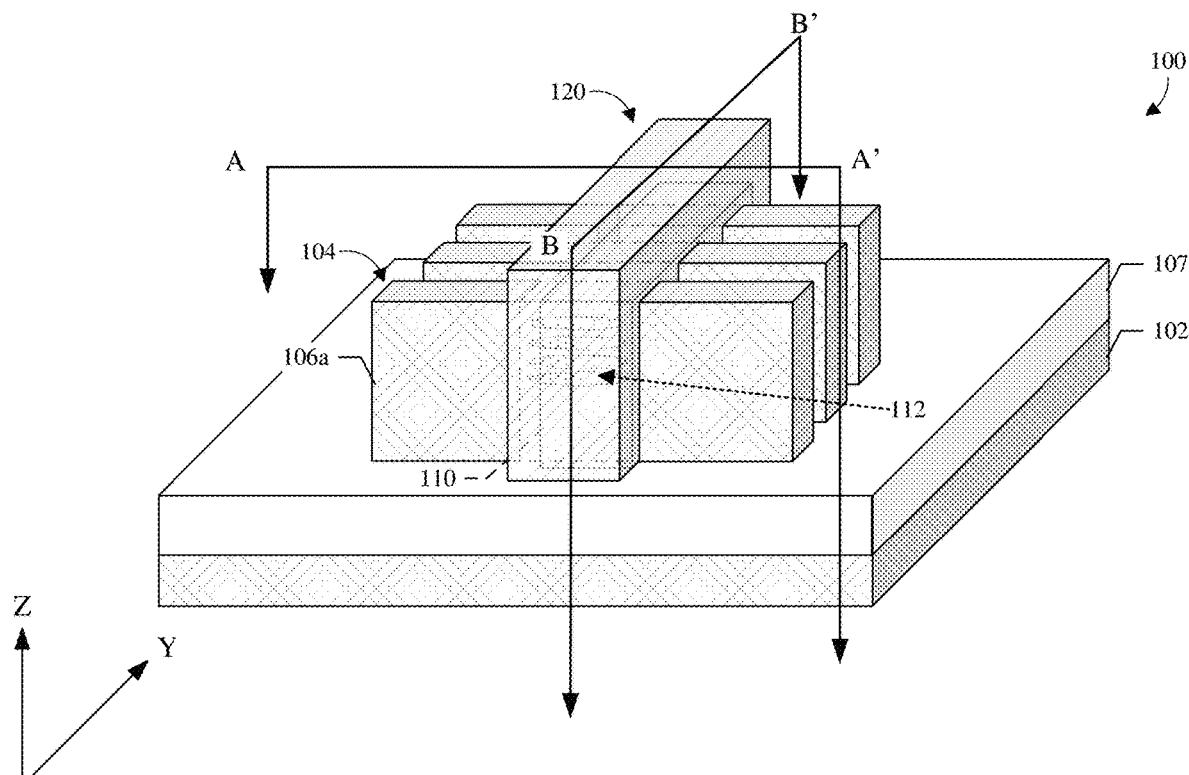
FIG. 1 illustrates a schematic view of some embodiments of a FinFET MOS capacitor.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. However, the same reference numerals may refer to like elements across different embodiments and different figures, and thus the drawings and associated descriptions may be incorporated across figures when not conflicting or may stand alone as independent embodiments. Also, varies cross-sectional views can either be associated with schematic views and/or cross-sectional views along other directions or lines, or stand alone as independent embodiments.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, as used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

Still further, as used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 1% of the reported numerical value.

For some integrated chips involving three-dimensional devices, capacitors such as metal-insulator-metal (MIM) capacitors are inserted in a back-end-of-line (BEOL) to be used as a part of the processing circuit. However, the BEOL interconnect wires introduce RC delays that may affect performance of the processing circuit. Also, the location of these capacitors in the BEOL restricts design flexibility and may affect chip integration when three-dimensional stacking of multiple dies is needed. For example, a CMOS image sensor (CIS) chip includes an image sensing die and an image signal processor (ISP) die one stacked over another. The image sensing die has color filters locating at its back-side configured to receive and filter incoming radiations and photodiodes underlying the color filters and configured to convert radiation to electrical signals. The ISP die includes a read-out circuit that receives and processes the electrical signals. The read-out circuit includes some capacitor components. These capacitor components can be metal-insulator-metal (MIM) capacitors that are inserted in the back-end-of-line (BEOL). However, the utilization of the BEOL MIM capacitors affects bonding interface of the image sensing die and the ISP die, and also introduces image distortion due to the RC delay introduced by the BEOL interconnect wires.

In view of the above, the present disclosure relates to a FinFET MOS capacitor that can be integrated in front-end-of-line (FEOL) with FinFET transistor devices. In some embodiments, the FinFET MOS capacitor comprises a capacitor fin structure extending upwardly from an upper surface of a substrate. The capacitor fin structure comprising a pair of dummy source/drain regions separated by a dummy channel region. The dummy channel region is heavily doped and function as one terminal of the FinFET MOS capacitor. A capacitor gate structure straddles on the capacitor fin structure and is separated from the capacitor fin structure by a capacitor gate dielectric. The capacitor gate structure functions as the other terminal of the FinFET MOS capacitor, and the capacitor gate dielectric function as a capacitor dielectric. The capacitor gate dielectric is thin and thus a greater capacitance can be achieved by the FinFET MOS capacitor compared to the previous MIM or metal-oxide-metal (MOM) capacitor.

In some embodiments, the dummy channel region is doped by a series of non-uniform doping steps such that multiple doped layers are one vertically stacked next to another. The dummy channel region may have a doping concentration greater than the pair of dummy source/drain regions. By controlling doped region of the dummy channel region, linearity of the FinFET MOS capacitor is enhanced. Since the dummy channel region of the capacitor fin structure may be doped by a series of ion implantation processes to form the multiple doped layers, the dummy channel region of the capacitor fin structure becomes more amorous compared to the fin structure of the FinFET transistor device. Thus, the dummy channel region of the capacitor fin structure may be consumed more when a thermal oxide process is performed to form gate dielectric. As a result, the capacitor fin structure may have a more tapered upper portion and a narrower width than the transistor fin structure, and the formed gate dielectric may have a greater width wrapping around sidewall and top surfaces of the dummy fin structure than that of the transistor fin structure.

FIG. 1 illustrates a schematic view of some embodiments of a FinFET MOS capacitor 100. As shown in FIG. 1, a substrate 102 may comprise an upper portion including a plurality of capacitor fin structures 104 extending upwardly from a planar lower portion. The isolation dielectric layer 107 may comprise silicon dioxide or other applicable dielectric materials. The capacitor fin structures 104 respectively comprises a pair of dummy source/drain regions 106a/106b separated by a dummy channel region 110. Unlike channel region for a transistor device, the dummy channel region 110 is heavily doped to increase conductivity such that the dummy channel region 110 behaves more like a good conductor (metal) and function as one terminal of the FinFET MOS capacitor 100. The dummy channel region 110 has a doped region 112 that have a doping type (e.g., n-type or p-type) same with the doping type of the source/drain regions 106a/106b. The doped region 112 may have a doping concentration greater than the pair of dummy source/drain regions 106a/106b. In some embodiments, the dummy channel region 110 may have a doping concentration more than twice greater than the pair of dummy source/drain regions 106a/106b. In some embodiments, the dummy channel region 110 comprises multiple doped layers one vertically stacked next to another. By controlling doped region of the dummy channel region 110, linearity of the FinFET MOS capacitor 100 is enhanced. For example, in some embodiments, the doped region 112 has a doping concentration about 2.5 times greater than that of the dummy source/drain regions 106a/106b, and has four doped layers one vertically stacked next to another. A resulting capacitance linearity is smaller than about 3%. The capacitance linearity defines a capacitance dependence of the applied gate bias.

A capacitor gate stack 120 straddles on the plurality of the capacitor fin structures 104 overlying the dummy channel region 110. The capacitor gate stack 120 may wrap a first sidewall, a top surface, and a second sidewall of respective capacitor fin structures 104. As shown in more details associated with cross-sectional views of FIGS. 2-4 below, the capacitor gate stack 120 comprises a capacitor gate structure 118 separated from the capacitor fin structure 104 by a capacitor gate dielectric 108. The capacitor gate structure 118 functions as the other terminal of the FinFET MOS capacitor 100, and the capacitor gate dielectric 108 functions as a capacitor dielectric. The capacitor gate dielectric is thin and thus a greater capacitance can be achieved by the FinFET MOS capacitor compared to the previous MIM or metal-oxide-metal (MOM) capacitor.

The substrate 102 may comprise any type of semiconductor body (e.g., monocrystalline silicon/CMOS bulk, silicon-germanium (SiGe), silicon on insulator (SOI), etc.). The capacitor fin structures 104 may be bulk semiconductor material fins or other three-dimensional structures such as vertically stacked nanowires, nano-dots, or other applicable structures. An isolation dielectric layer 107 may be disposed on the planar lower portion of the substrate 102 providing isolation function for the substrate 102. In some embodiments, the capacitor gate stack 120 has a bottom surface reaching on an upper surface of the isolation dielectric layer 107.

Figure 2:
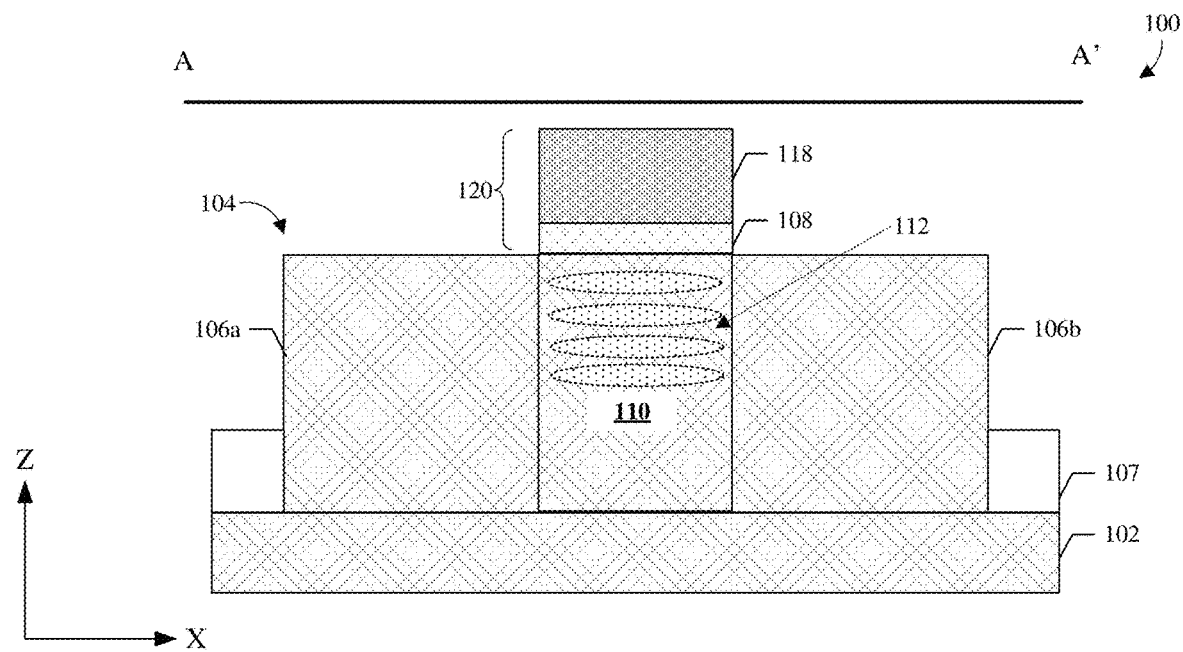
FIGS. 2 and 3 illustrate cross-sectional views of varies embodiments of the FinFET MOS capacitor of FIG. 1 along X-direction.
Figure 3:
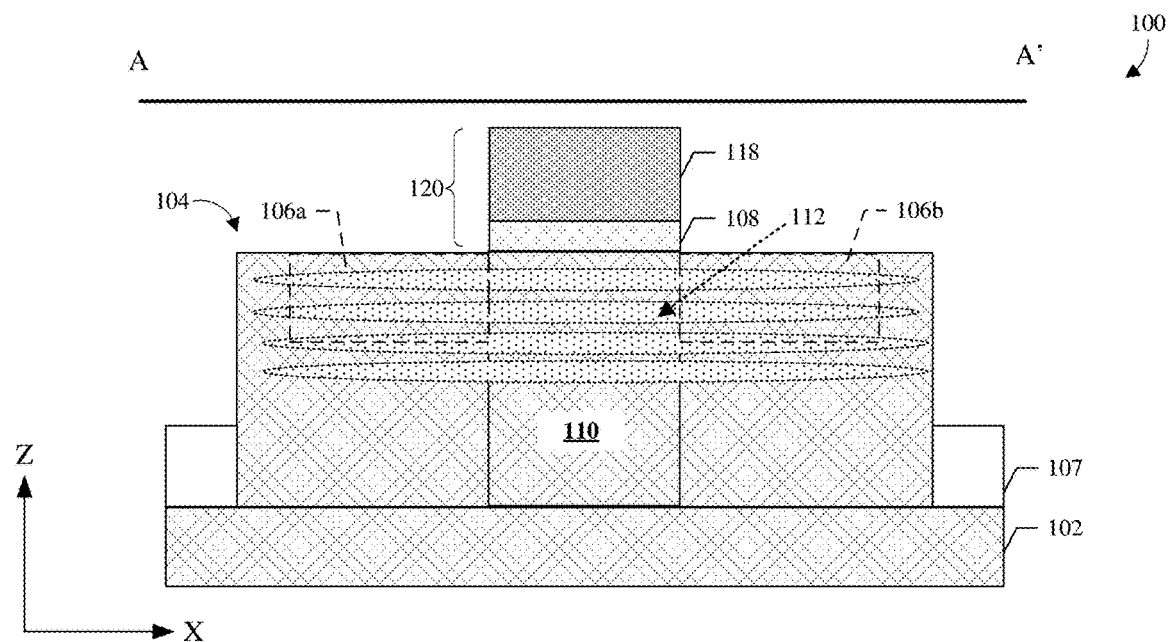

FIG. 2 and FIG. 3 illustrate cross-sectional views of varies embodiments of a FinFET MOS capacitor along line A-A'. FIG. 2 may be a cross-sectional view of some embodiments of the FinFET MOS capacitor 100 of FIG. 1 along line A-A'. As shown in FIG. 2, in some embodiments, the capacitor fin structures 104 comprises the pair of source/drain regions 106a/106b spaced apart by the dummy channel region 110. The doped region 112 is arranged within the dummy channel region 110. As shown in FIG. 3, in some alternative embodiments, the pair of source/drain regions 106a/106b may be arranged at an upper portion of the capacitor fin structures 104. The doped region 112 may be arranged across upper regions of the pair of source/drain regions 106a/106b and the dummy channel region 110. A capacitor gate stack 120 is disposed between the source/drain regions 106a/106b overlying the dummy channel region 110. In some embodiments, the capacitor gate stack 120 comprises the capacitor gate structure 118 separated from the dummy channel region 110 by the capacitor gate dielectric 108. The doped region 112 may have a doping concentration greater in an inner region of the dummy channel region 110 than an outer region of the dummy channel region in lateral directions along plane of the substrate 102 such as both X direction and Y direction.

Figure 4:
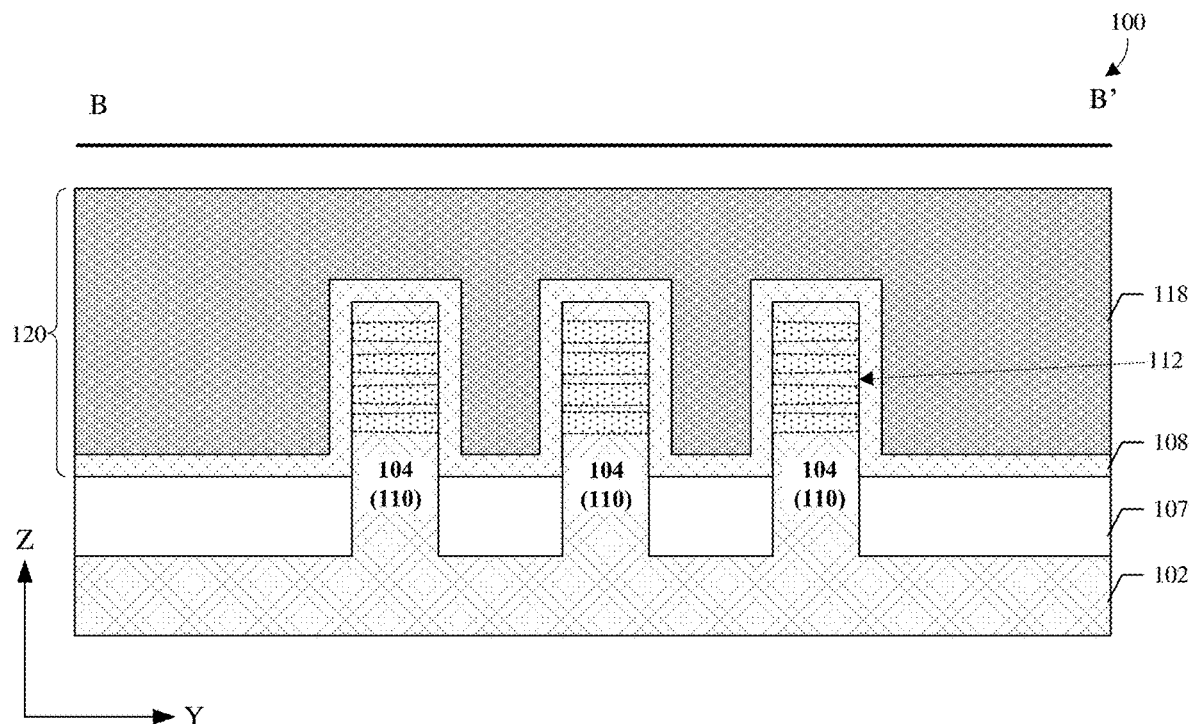
FIG. 4 illustrates a cross-sectional view of some embodiments of the FinFET MOS capacitor of FIG. 1 along Y-direction.

FIG. 4 illustrates a cross-sectional view of some embodiments of a FinFET MOS capacitor. FIG. 4 may be a cross-sectional view of some embodiments of the FinFET MOS capacitor 100 of FIG. 1 along line B-B'. As shown in FIG. 3, the doped region 112 is arranged in an upper region of the dummy channel regions 110. The capacitor gate stack 120 straddles on the plurality of the capacitor fin structures 104 overlying the dummy channel region 110. The capacitor gate dielectric 108 is disposed between the capacitor fin structures 104 and the capacitor gate structure 118, wrapping a first sidewall, a top surface, and a second sidewall of respective capacitor fin structures 104, and functioning as a capacitor dielectric. By this multiple fin structures, the capacitor area is enlarged without increasing the lateral footprint of the capacitor, and thus a greater capacitance can be achieved by the FinFET MOS capacitor 100.

Figure 5:
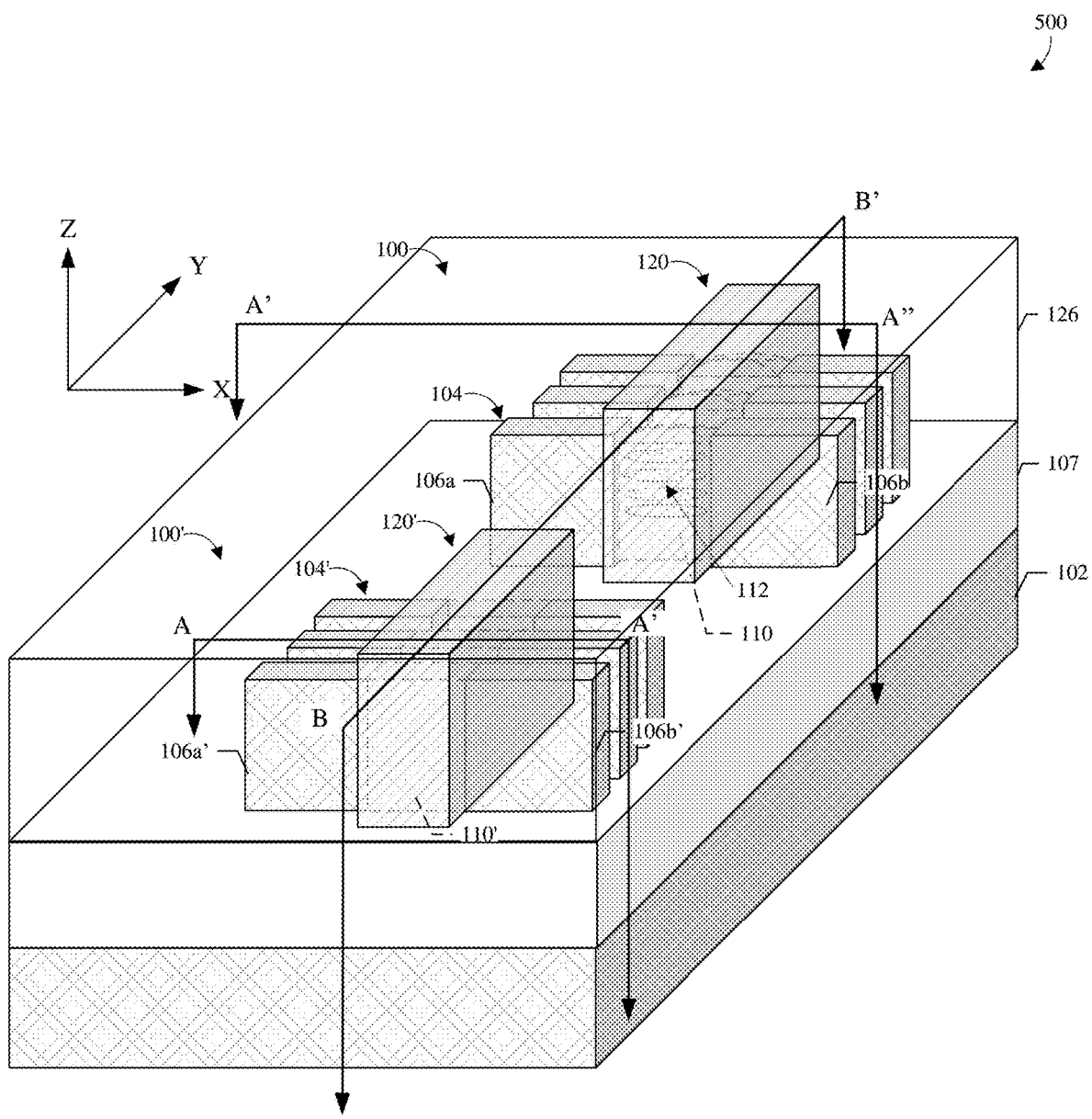
FIG. 5 illustrates a schematic view of some embodiments of an integrated circuit comprising a FinFET MOS capacitor and a FinFET transistor integrated in one substrate.

FIG. 5 illustrates a schematic view of some embodiments of an integrated circuit 500 comprising a FinFET MOS capacitor 100 and a FinFET transistor 100' integrated in one substrate 102. Similar as discussed above associated with FIGS. 1-4, the FinFET MOS capacitor 100 comprises a plurality of capacitor fin structures 104 respectively having a pair of dummy source/drain regions 106a/106b separated by a dummy channel region 110. A capacitor gate stack 120 straddles on the plurality of the capacitor fin structures 104 overlying the dummy channel region 110. The capacitor gate stack 120 comprises a capacitor gate structure 118 separated from the capacitor fin structure 104 by a capacitor gate dielectric 108. The FinFET transistor 100' comprises a plurality of transistor fin structures 104' respectively having a pair of source/drain regions 106a'/106b' separated by a channel region 110'. A transistor gate stack 120' straddles on the plurality of the transistor fin structures 104' overlying the channel region 110'. The transistor gate stack 120' comprises a transistor gate structure 118' separated from the transistor fin structures 104' by a transistor gate dielectric 108'. It is noted that the FinFET MOS capacitor 100 and the FinFET transistor 100' are shown as one next to another for illustration convenience and simplicity. Other device components and structures may be arranged between the FinFET MOS capacitor 100 and the FinFET transistor 100'.

Figure 6:
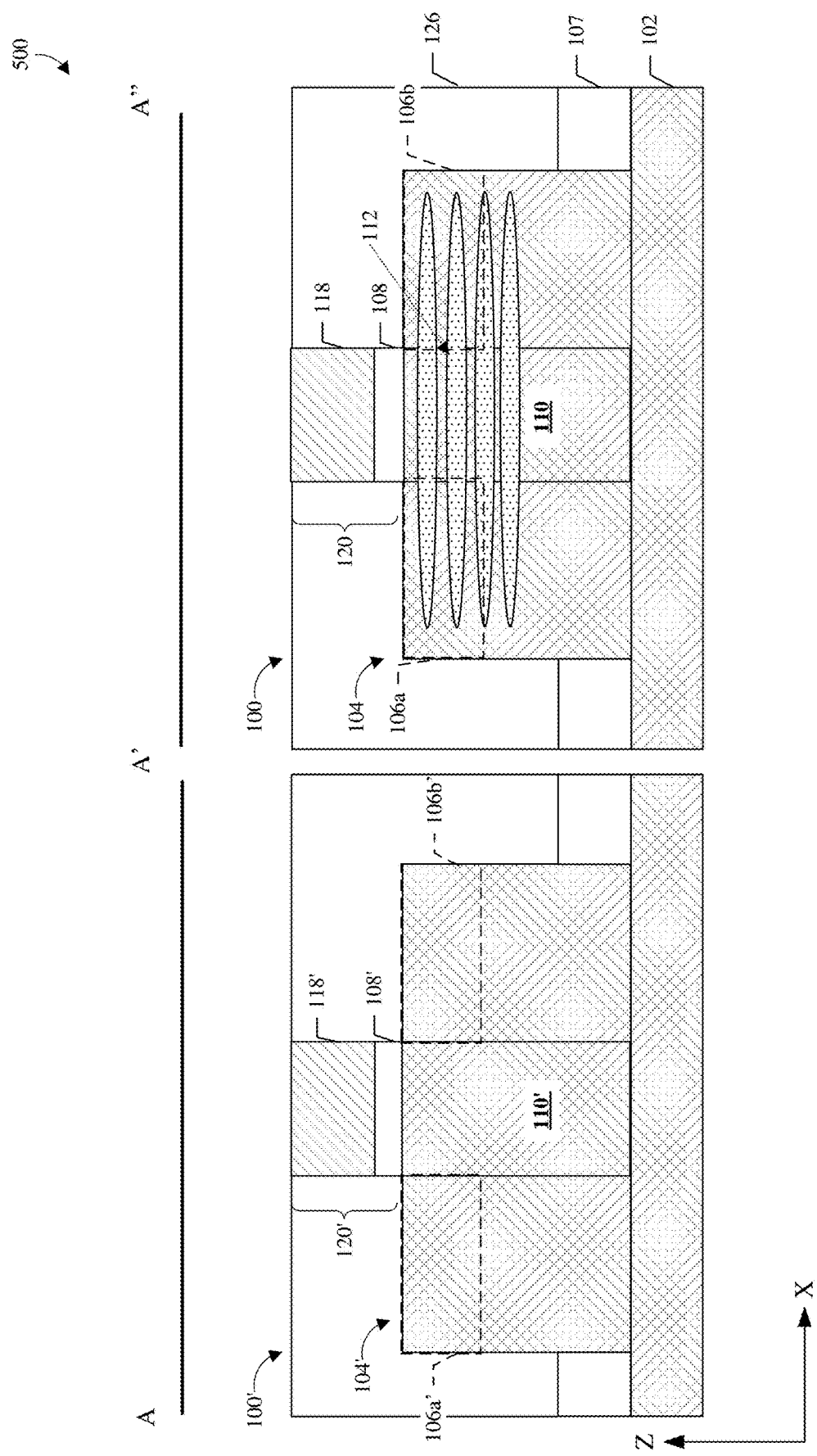
FIG. 6 illustrates a cross-sectional view of some embodiments of the integrated circuit of FIG. 5 along X-direction.

FIG. 6 illustrates a cross-sectional view of some embodiments of an integrated circuit. FIG. 6 may be a cross-sectional view of some embodiments of the integrated circuit 500 of FIG. 5 along line A-A'. For FinFET transistor 100', the channel region 110' may be intrinsic or lightly doped with a doping type opposite with that of the source/drain regions 106a'/106b', and current in the channel region 110' is controlled by a gate voltage applied to the transistor gate stack 120'. The source/drain regions 106a'/106b' are heavily doped and a drain bias is applied across the source/drain regions 106a'/106b' during the operation. For FinFET MOS capacitor 100, the dummy channel region 110 is heavily doped with a doping type same with that of the dummy source/drain regions 106a/106b. A doping concentration of the dummy channel region 110 may be greater than the pair of dummy source/drain regions 106a/106b. In some embodiments, the dummy source/drain regions 106a/106b and the dummy channel region 110 are n-type doped. In some alternative embodiments, the dummy source/drain regions 106a/106b and the dummy channel region 110 are p-type doped. The dummy source/drain regions 106a/106b may have a doping concentration substantially same with that of the source/drain regions 106a'/106b' of the same doping type. In some embodiments, the dummy channel region 110 comprises the doped region 112 with multiple doped layers one vertically stacked next to another. The doped region 112 may have a doping concentration greater in an inner region of the dummy channel region 110 than an outer region of the dummy channel region in X direction. The dummy channel region 110 and the dummy source/drain regions 106a/106b may collectively function as one terminal of the FinFET MOS capacitor 100. By controlling doped region of the dummy channel region 110, linearity of the FinFET MOS capacitor 100 is enhanced.

Figure 7:
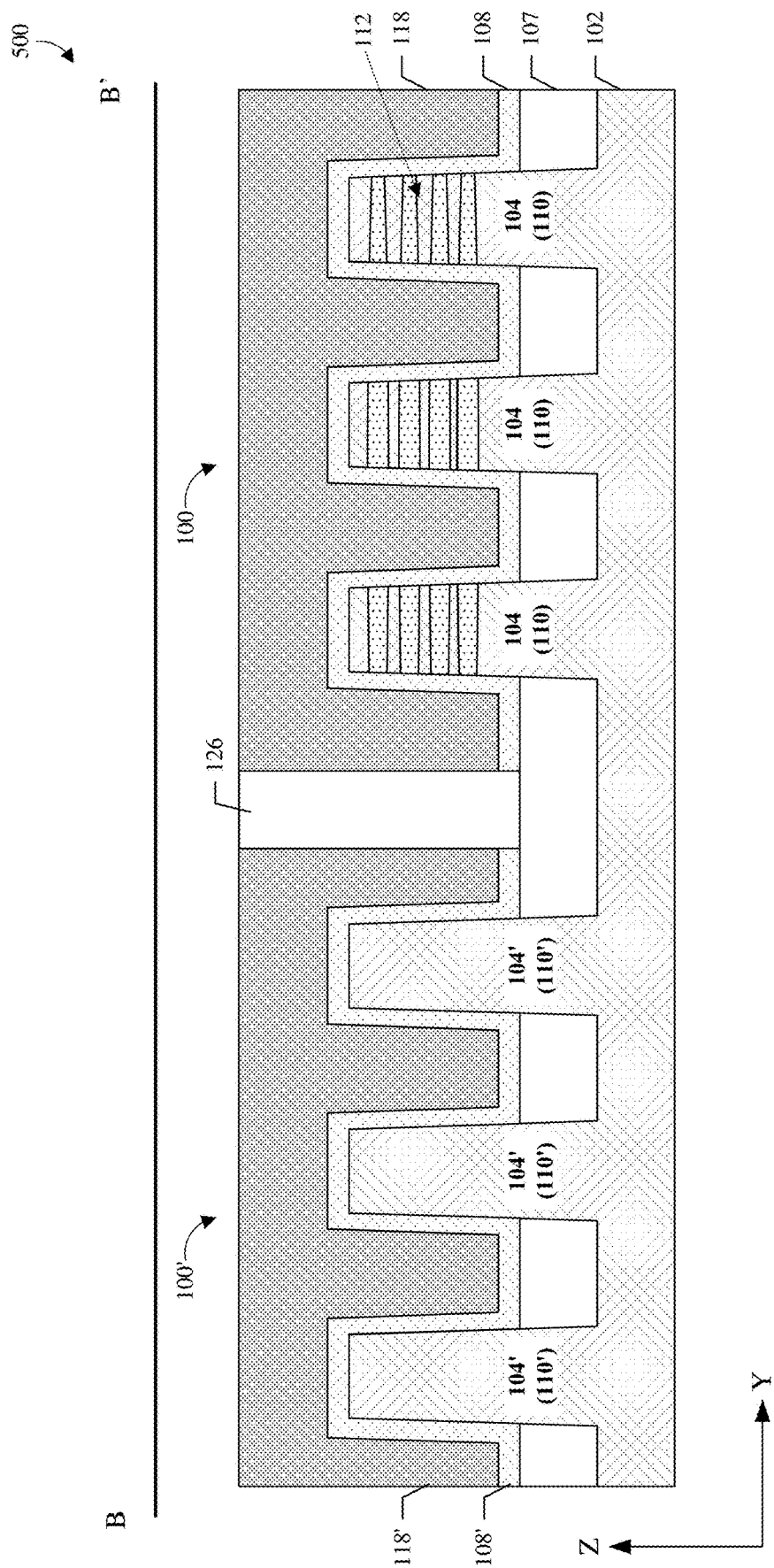
FIGS. 7 and 8 illustrate cross-sectional views of varies embodiments of the integrated circuit of FIG. 5 along Y-direction.

FIG. 7 illustrates a cross-sectional view of some embodiments of an integrated circuit. FIG. 7 may be a cross-sectional view of some embodiments of the integrated circuit 500 of FIG. 5 along line B-B'. As discussed above, for FinFET MOS capacitor 100, upper portions of the dummy channel regions 110 of the plurality of capacitor fin structures 104 are heavily doped. In some embodiments, the dummy channel region 110 comprises the doped region 112 with multiple doped layers one vertically stacked next to another. The doped region 112 may have a doping concentration greater in an inner region of the dummy channel region 110 than an outer region of the dummy channel region in Y direction. In comparison, for FinFET transistor 100', the channel region 110' of the plurality of transistor fin structures 104' may be intrinsic or lightly doped.

Figure 8:
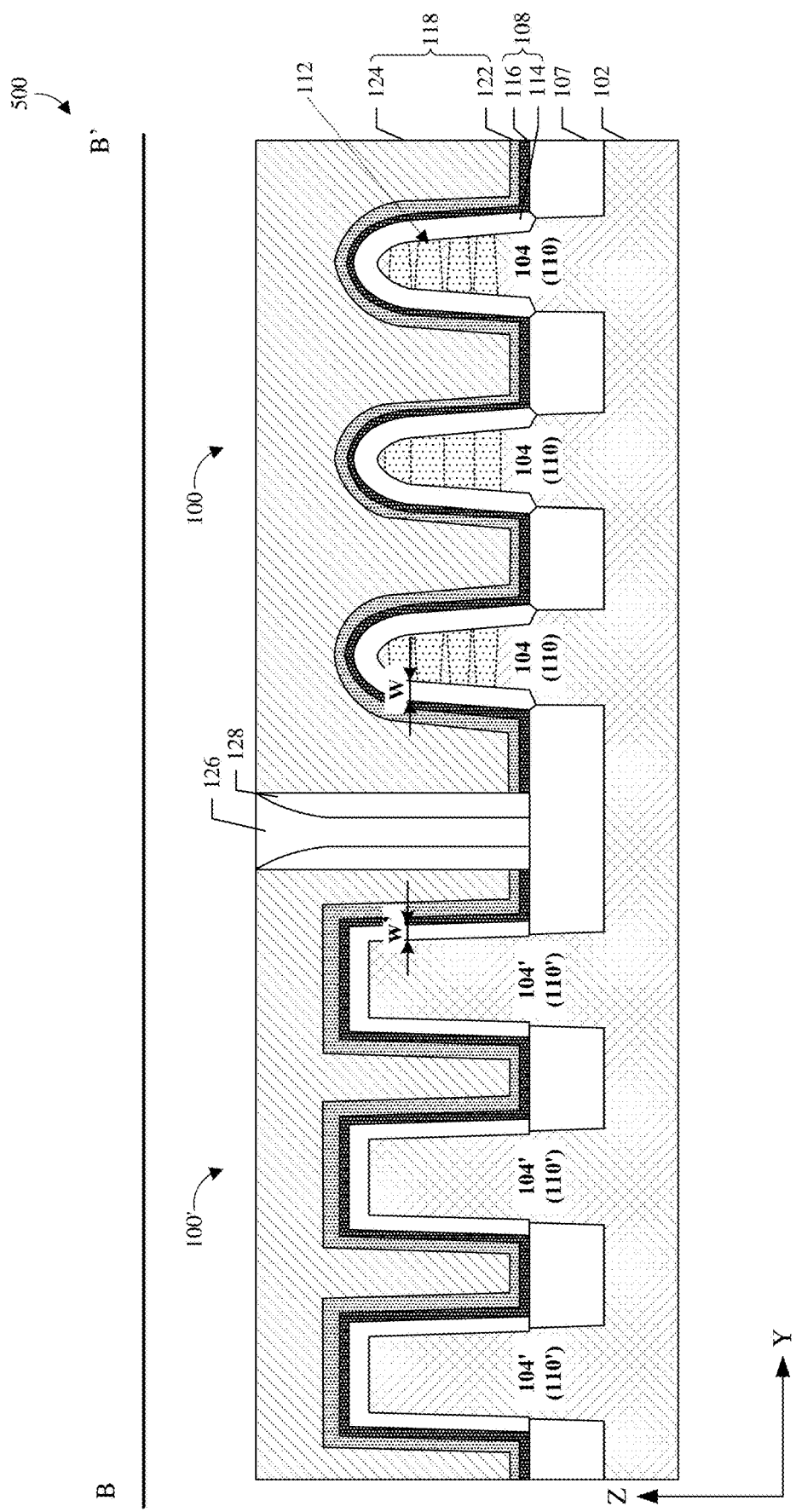

FIG. 8 illustrates a cross-sectional view of some additional embodiments of an integrated circuit. FIG. 8 may be a cross-sectional view of some embodiments of the integrated circuit 500 of FIG. 5 along line B-B'. In some embodiments, the capacitor fin structure 104 has an upper portion more tapered than that of the transistor fin structure 104'. The capacitor fin structure 104 may have a more amorphous outer peripheral than that of the transistor fin structure 104'. The capacitor fin structure 104 may have a width smaller than that of the transistor fin structure 104'. The capacitor gate dielectric 108 may have a width greater than that of the transistor gate dielectric 108'. The capacitor fin structure 104 may have a height substantially equal to that of the transistor fin structure 104'.

In some embodiments, the capacitor gate dielectric 108 and the transistor gate dielectric 108' may comprise an interfacial dielectric layer 114 and a high-k dielectric layer 116 disposed on the interfacial dielectric layer 114. The capacitor gate structure 118 and the transistor gate structure 118' may comprise a work function metal layer 122 and a bulk metal gate layer 124. As shown in FIG. 7, the interfacial dielectric layer 114 may have a first width w for the FinFET MOS capacitor 100 and a second width w' for the FinFET transistor 100'. The first width w is greater than the second width w'.

In some embodiments, the FinFET MOS capacitor 100 or the integrated circuit 500 may be a part of a front-end-of-line (FEOL) of an image signal processor (ISP) chip that is bonded to a CMOS image sensor (CIS) chip as one integrated chip. The integrated chip may be an image sensing chip configured to receive a radiation and convert the radiation to electronic signals and may further process such electronic signals. The ISP chip may include logic core devices and I/O devices disposed on one substrate and a first interconnect structure disposed over and electrically coupled to the I/O devices. The CIS chip may include radiation sensing components such as filters and photodiodes and a second interconnect structure disposed over and electrically coupled to the sensing components. The ISP chip and the CIS chip may be bonded together by applicable bonding techniques. In some embodiments, the ISP chip and the CIS chip are bonded face to face having the first interconnect structure and the second interconnect structure face each other. The FinFET MOS capacitor may be integrated in front-end (FEOL) of the ISP chip together with other logic devices and the I/O devices, and is disposed between the first interconnect structure and the substrate of the ISP chip.

Figures 21A, 21B:
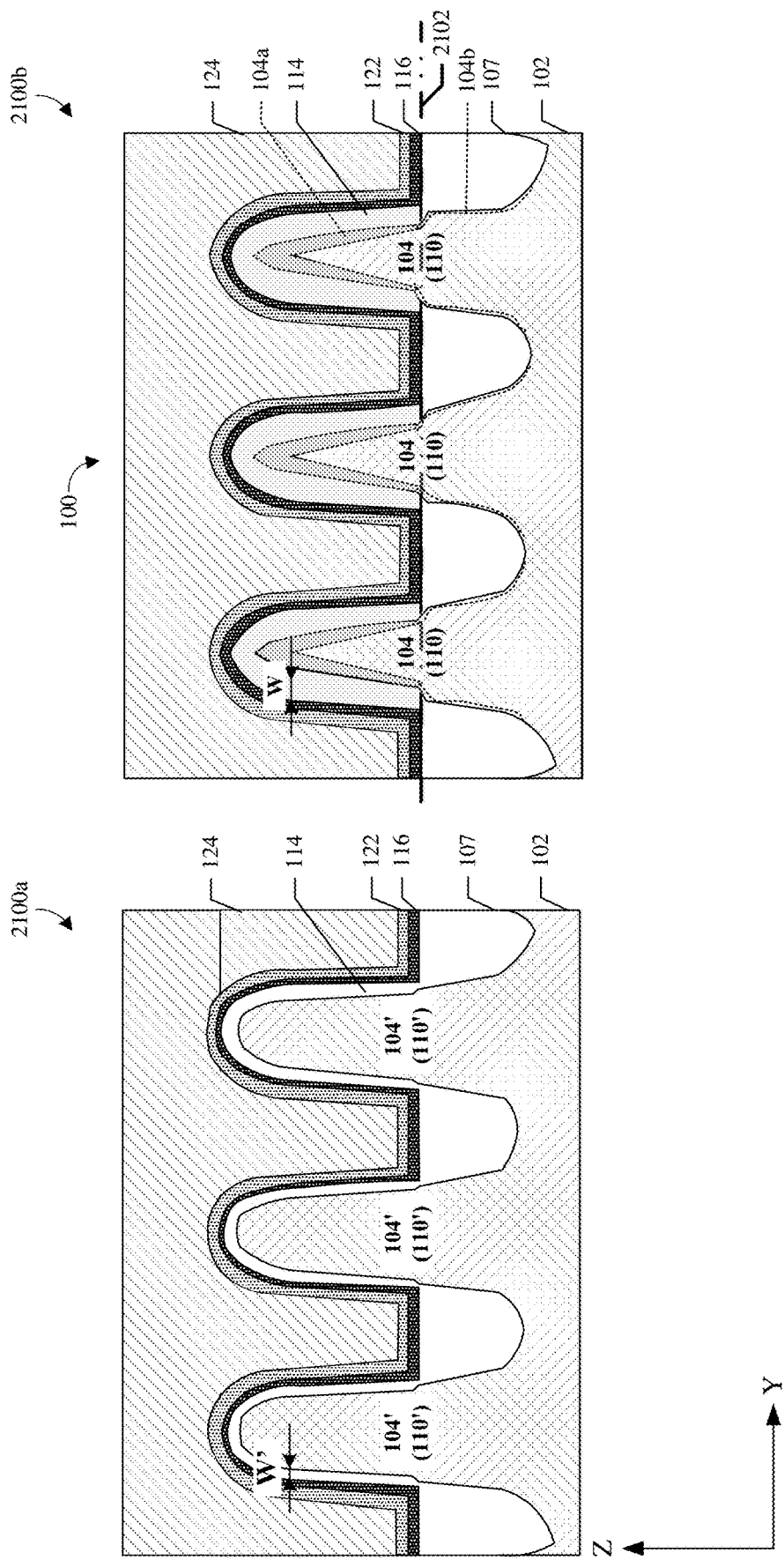
FIGS. 21A-21B illustrate cross-sectional views of some additional embodiments of a transistor region and a capacitor region of an integrated circuit.

FIGS. 21A-21B illustrate cross-sectional views of an integrated circuit according to some additional embodiments. FIG. 21A shows a transistor region 2100a of the integrated circuit, and FIG. 21B shows a capacitor region 2100b of the integrated circuit. FIG. 21A and FIG. 21B may be cross-sectional views of some embodiments of the integrated circuit 500 of FIG. 5 along a direction of line B-B'. Similar as described above, in some embodiments, the transistor fin structure 104' of the transistor region 2100a and the capacitor fin structure 104 of the capacitor region 2100b are surrounded by an interfacial dielectric layer 114, a high-k dielectric layer 116 disposed on the interfacial dielectric layer 114, a work function metal layer 122, and a bulk metal gate layer 124. In some embodiments, the capacitor fin structure 104 is heavily doped such that the linearity of the FinFET MOS capacitor 100 is enhanced. In some embodiments, the capacitor fin structure 104 is doped with a doping concentration greater than that of the pair of dummy source/drain regions 106a/106b as shown in FIG. 5. In some embodiments, the capacitor fin structure 104 is doped with a doping concentration more than 2.5 times greater than that of the pair of dummy source/drain regions 106a/106b. In some embodiments, the capacitor fin structure 104 has an upper portion more tapered than that of the transistor fin structure 104'. Because of the high doping concentration, the capacitor fin structure 104 may have a more amorphous outer peripheral next to the interfacial dielectric layer 114 than that of the transistor fin structure 104'. In some embodiments, an amorphous region 104a of the capacitor fin structure 104 above a fin height line 2102 is more than about 50% of the whole volume of the capacitor fin structure 104 above the fin height line 2102. An amorphous region 104b of the capacitor fin structure 104 below the fin height line 2102 is about 10% of the whole volume of the capacitor fin structure 104 below the fin height line 2102. The great level of amorphous is the result of the heavy doping of capacitor fin structure 104, which would result in an enhanced linearity of the FinFET MOS capacitor 100. For example, a resulting capacitance linearity is smaller than about 3%. Without such a high doping level or amorous level as disclosed above, the capacitance linearity may suffer. Also as a result of heavy doping of the capacitor fin structure 104, the capacitor fin structure 104 may have a width smaller than that of the transistor fin structure 104', and the interfacial dielectric layer 114 may have a first width w in the capacitor region 2100b greater than a second width w' in the transistor region 2100a. In some embodiments, a surface area of the capacitor fin structure 104 of a sum of upper, lower and sidewall surfaces is about 2.5 times of a corresponding lateral planar surface area, and a resulting capacitance of the capacitor fin structure 104 is about twice of capacitance of a corresponding planar capacitor. The capacitor fin structure 104 is difficult to be formed and doped if the sum of upper, lower and sidewall surfaces is greater than about 5 times of the corresponding lateral planar surface area, and the benefit of enlarging surface area is minimal if the urn of upper, lower and sidewall surfaces is smaller than about 1.2 times of the corresponding lateral planar surface area.

FIGS. 9-19 illustrate a series of cross-sectional views 900-1900 of some embodiments for forming an integrated circuit having a FinFET MOS capacitor, such as the integrated circuit 500 shown in FIG. 5. FIGS. 9-19 show different stages of a manufacturing process and can be cross-sectional views taken from one direction of the integrated circuit, such as taken from Y direction shown in FIG. 5.

Figure 9:
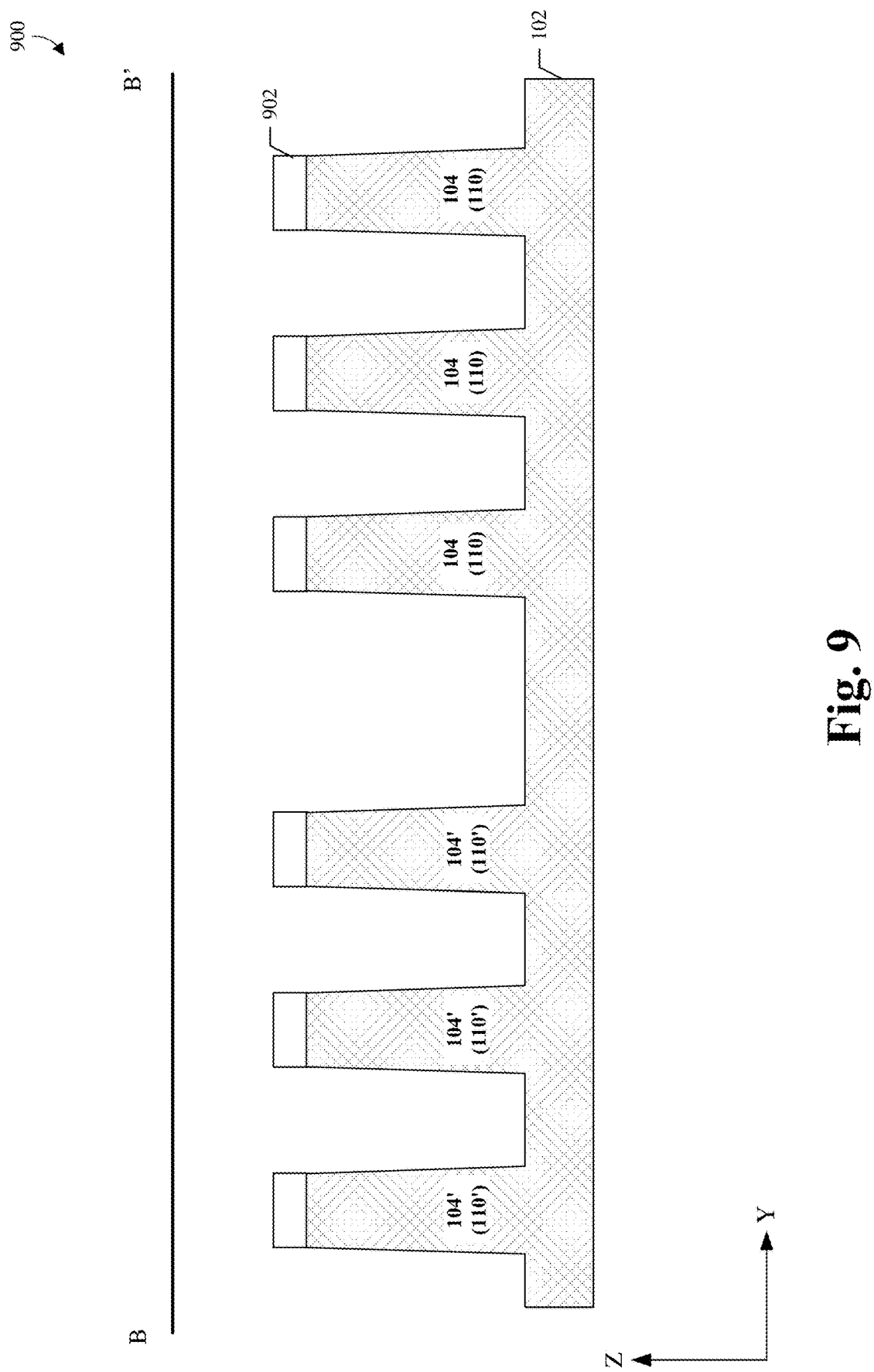
FIGS. 9-19 illustrate a series of cross-sectional views of some embodiments for forming a FinFET MOS capacitor.

As shown in FIG. 9, a substrate 102 is prepared. In some embodiments, a plurality of fin structures 104, 104' is formed from an upper portion of the substrate 102. The substrate 102 may comprise any type of semiconductor body (e.g., monocrystalline silicon/CMOS bulk, silicon-germanium (SiGe), silicon on insulator (SOI), etc.). The fin structures 104, 104' may be patterned by varies methods. For example, the fin structures 104, 104' may be patterned using one or more photolithography processes, including double-patterning or multi-patterning processes. Double-patterning or multi-patterning processes combine photolithography and self-aligned processes, allowing patterns to be created that have, for example, pitches smaller than what is otherwise obtainable using a single, direct photolithography process. For example, in one embodiment, a mandrel layer (not shown) is formed over a hard mask layer and patterned using a photolithography process. The hard mask layer may be made of one or more dielectric material such as a silicon nitride layer on a pad oxide layer. Then, a spacer is formed alongside the patterned mandrel layer using a self-aligned process. The mandrel layer is then removed, and the spacer is used to pattern the hard mask layer to form a hard mask 902 that is then used to pattern the fin structures 104, 104'.

Figure 10:
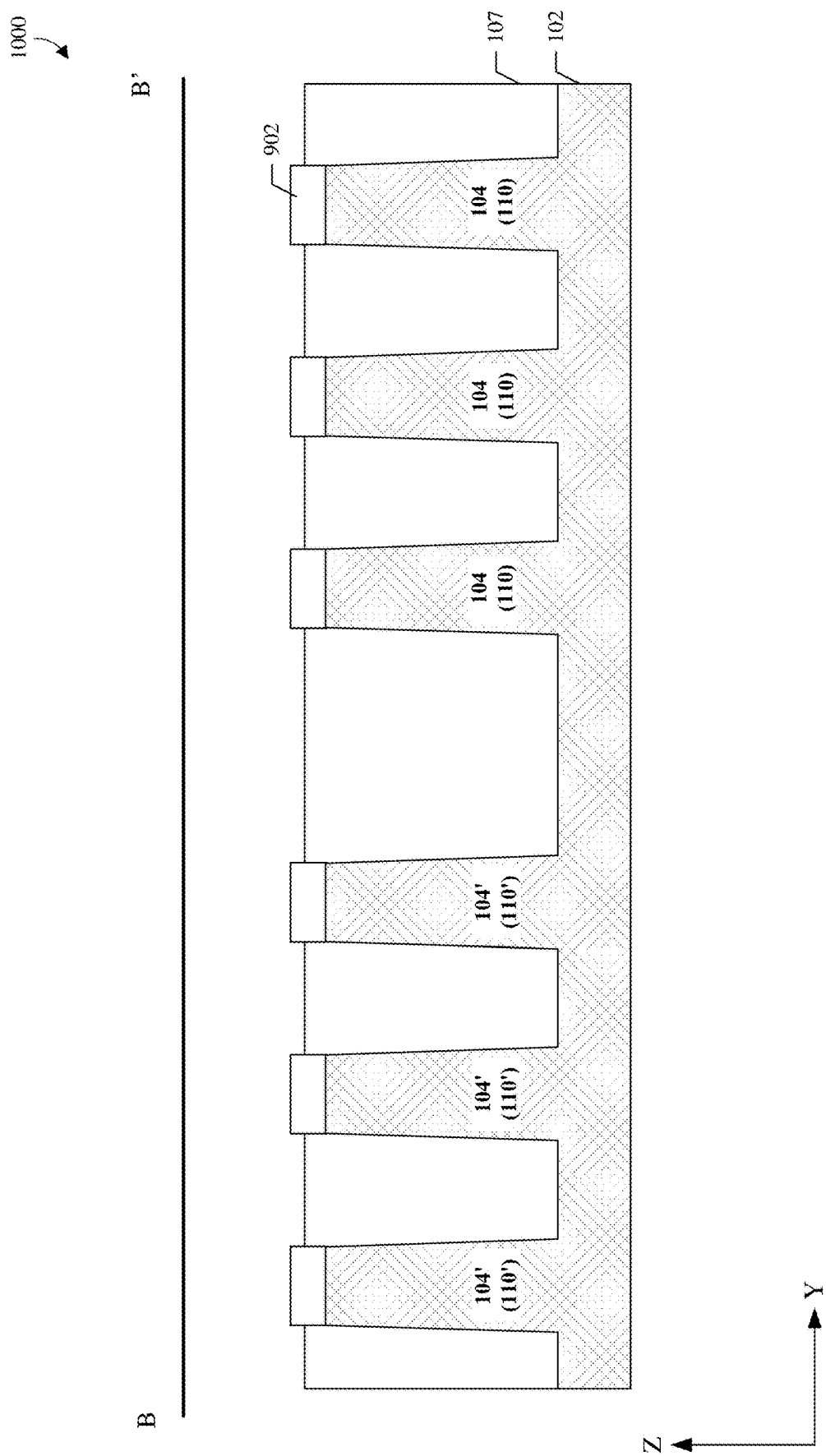

As shown in FIG. 10, an isolation dielectric layer 107 is formed surrounding the fin structures 104, 104'. The isolation dielectric layer 107 may comprise silicon dioxide or other applicable dielectric materials, such as a nitride, a carbide, or the like. The isolation dielectric layer 107 can be formed by a deposition process followed by a planarization process to be co-planar with the hard mask 902. The isolation dielectric layer 107 is then etched back to a position between top and bottom surfaces of the hard mask 902.

Figure 11:
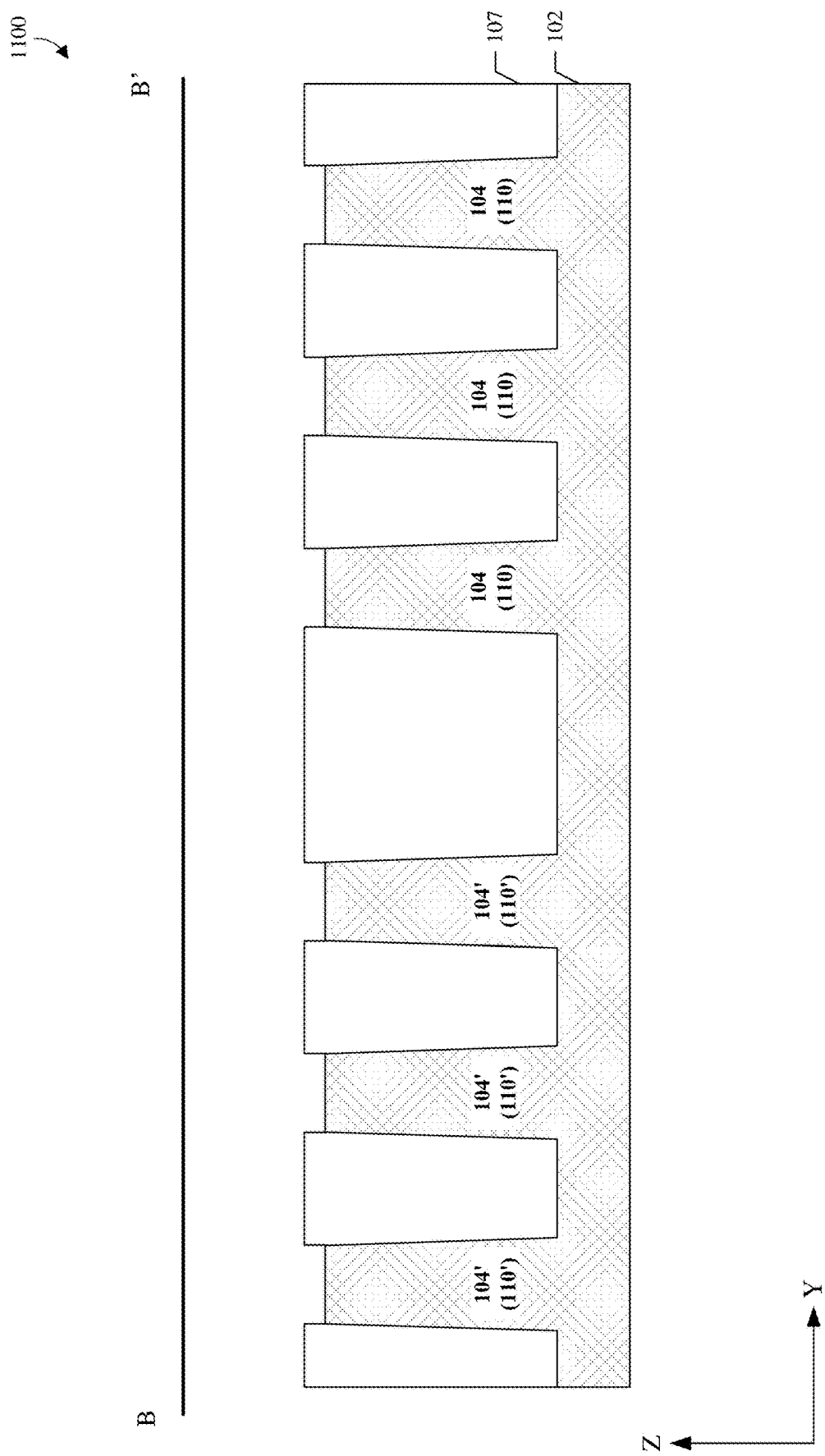

As shown in FIG. 11, the hard mask 902 is removed, and top surfaces of the fin structures 104, 104' are exposed. The hard mask removal process may comprise wet etching processes and/or dry etching processes.

Figure 12:
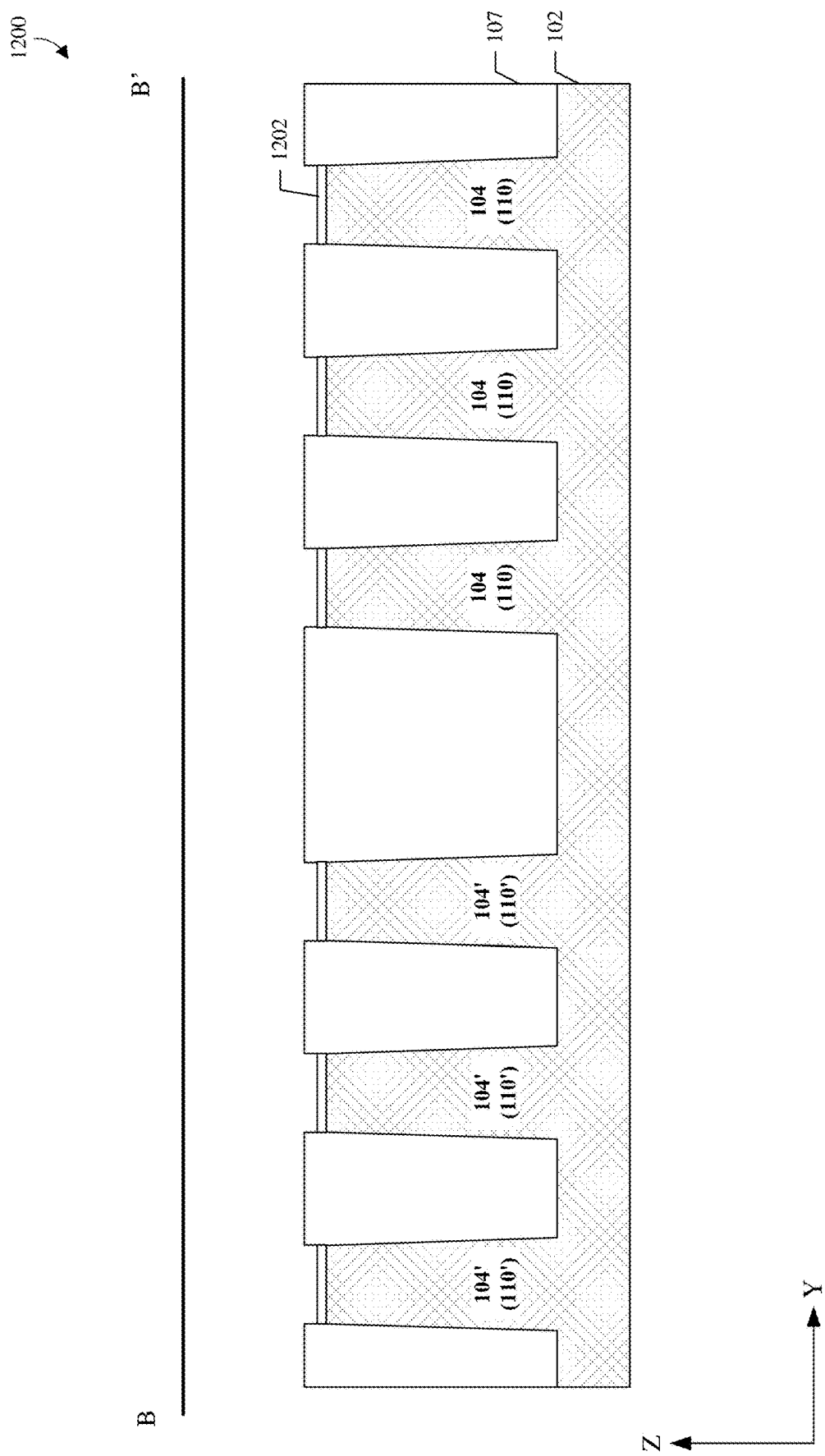

As shown in FIG. 12, a sacrificial layer 1202 is formed lining the top surfaces of the fin structures 104, 104'. As an example, the sacrificial layer 1202 can be formed by a thermal oxidation process such as an in-situ steam generation (ISSG) process.

Figure 13:
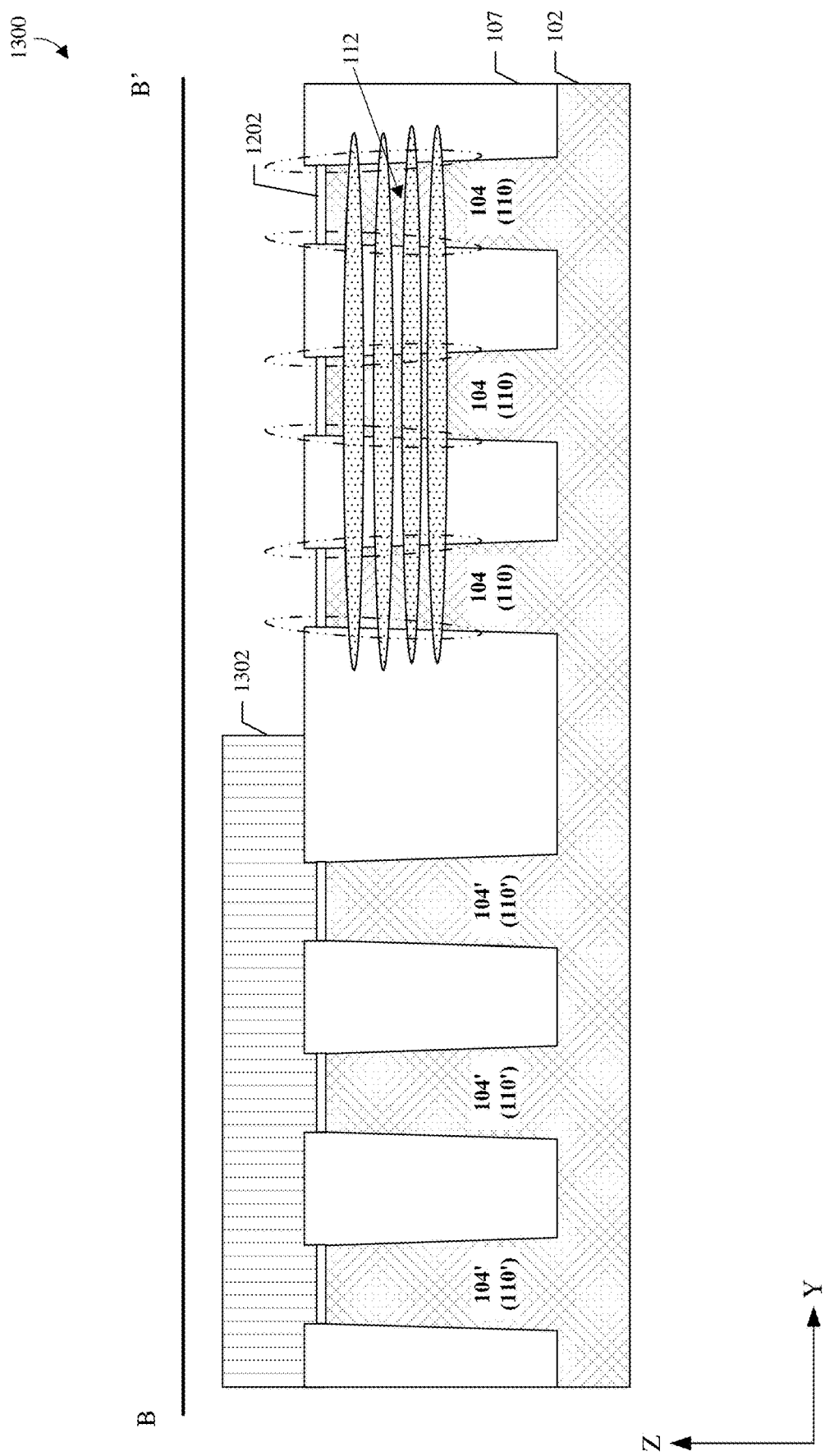

As shown in FIG. 13, a series of ion implantation processes is performed to form doping wells in fin structures 104, 104' and a doped region 112 in the capacitor fin structures 104. The transistor fin structures 104 may be covered and protected by a protection layer 1302 from the implantation when forming the doped region 112 in the capacitor fin structures 104. In some embodiments, the doped region 112 may be formed using an angled ion implantation process. In some embodiments, the doped region 112 is formed with multiple doped layers one vertically stacked next to another. The doped region 112 may be formed in an upper region of the dummy channel region 110 having a doping concentration greater in an inner region than an outer region of the dummy channel region in lateral directions. For example, in some embodiments, the doped region 112 is formed by four ion implantation processes with ion dosage and energy increasing from a top doped layer near surface to a bottom doped layer deep in the dummy channel region 110 to form four doped layers one vertically stacked next to another. The resulting doped layers may each have a greater thickness from top to bottom. A resulting capacitance linearity is smaller than about 3%. The capacitance linearity defines a capacitance dependence of the applied gate bias. By controlling doped region of the dummy channel region 110, linearity of the FinFET MOS capacitor 100 is enhanced.

Figure 14:
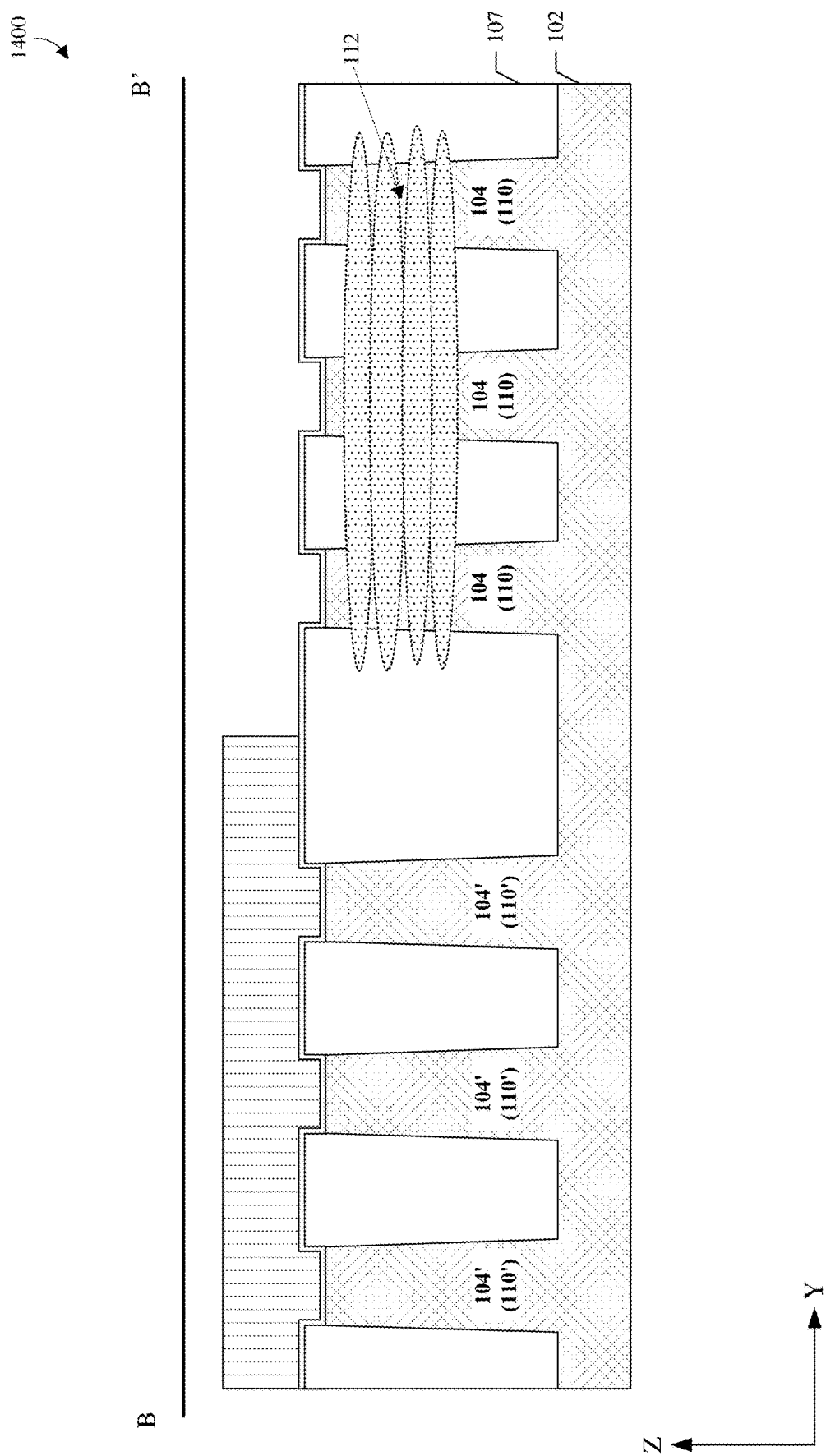

As shown in FIG. 14, an annealing process is performed. The annealing process can be performed by a rapid thermal annealing (RTA) method. The doped region 112 is settled after the annealing process.

Figure 15:
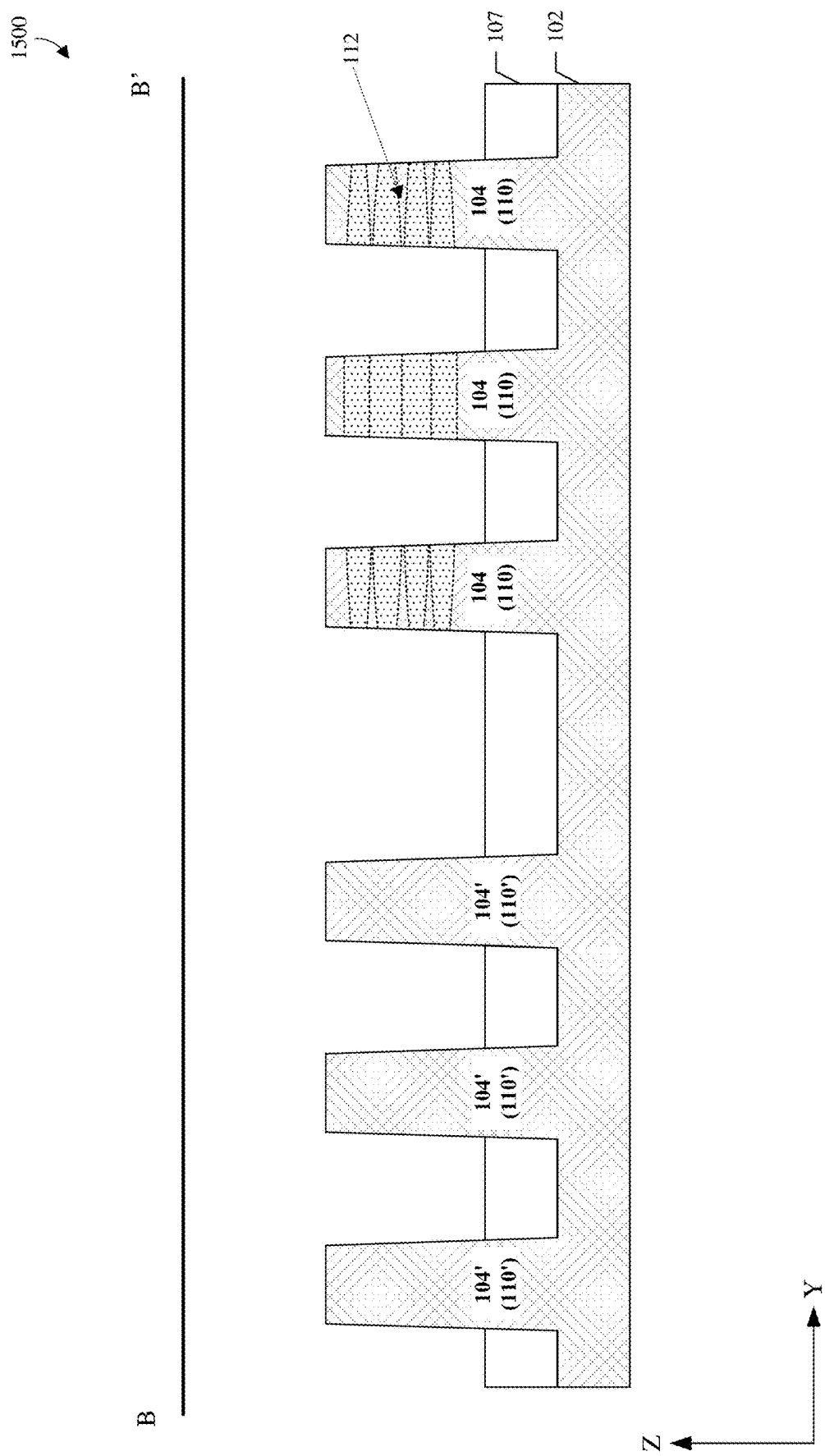

As shown in FIG. 15, the isolation dielectric layer 107 is etched back to a lower position to expose an upper portion of the fin structures 104, 104'. The sacrificial layer 1202 is also removed during this process.

Figure 16:
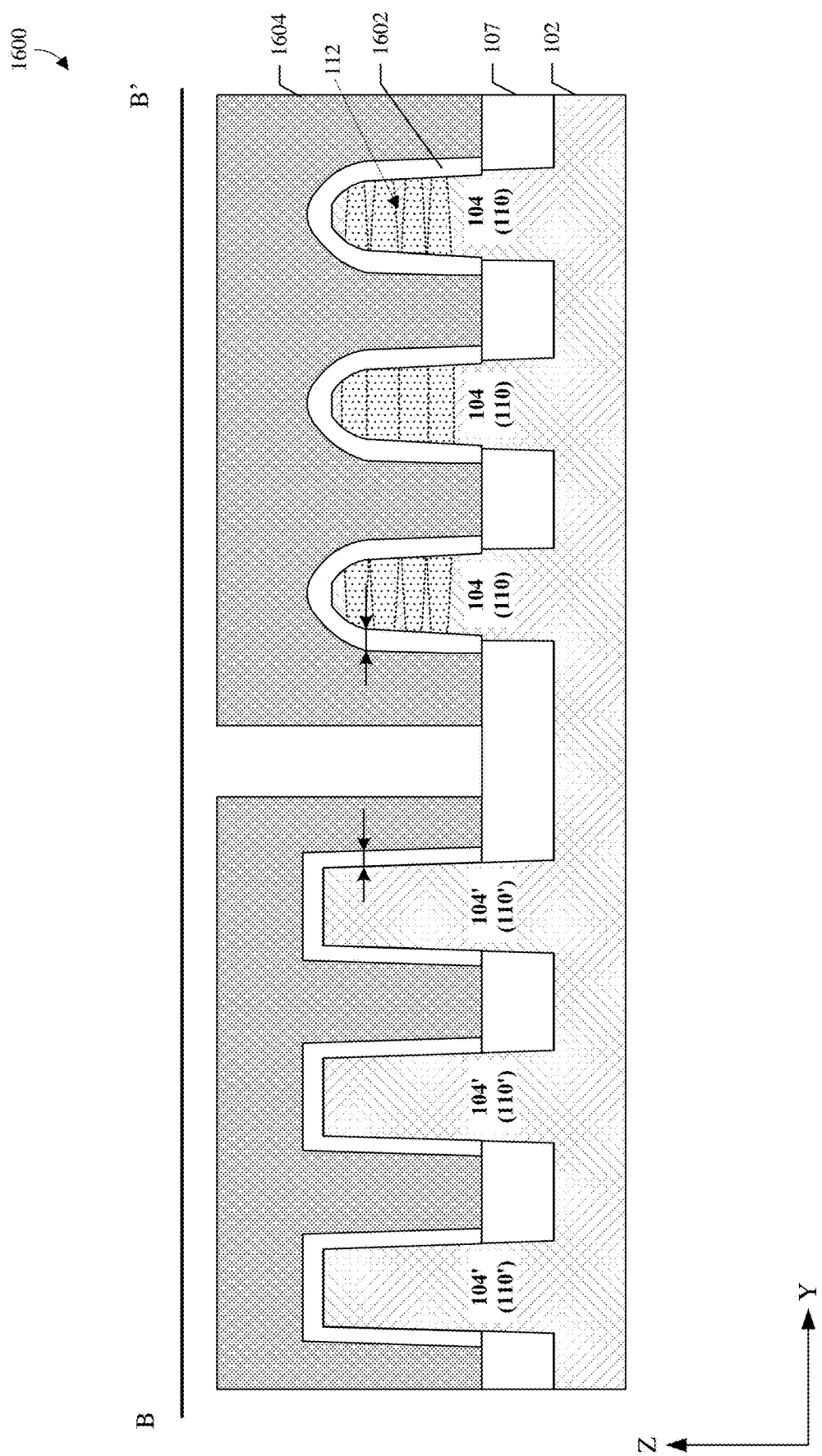

As shown in FIG. 16, a gate dielectric layer 1602 and a gate electrode layer 1604 are formed overlying the fin structures 104, 104'. In some embodiments, the gate dielectric layer 1602 and the gate electrode layer 1604 are formed by a deposition process followed by a patterning process. In some embodiments, the gate dielectric 1602 may comprise, for example, an oxide (e.g., $SiO_2$), a high-k dielectric material (e.g., HfO2, ZrO2, or some other dielectric material with a dielectric constant greater than about 3.9), some other dielectric material, or a combination of the foregoing. In yet further embodiments, the gate dielectric layer 1602 may be deposited or grown by thermal oxidation, chemical vapor deposition (CVD), physical vapor deposition (PVD), atomic layer deposition (ALD), sputtering, or some other deposition or growth process. In some embodiments, the gate electrode layer 1604, may comprise, for example, polysilicon. The gate electrode layer 1604 may be deposited or grown by CVD, PVD, ALD, epitaxy, sputtering, or some other deposition or growth process. The gate dielectric layer 1602 and the gate electrode layer 1604 are patterned into an initial gate stack 1702 (see FIG. 17). In some embodiments, a process for forming the initial gate stack 1702 comprises forming a masking layer 1704 over/on the gate electrode layer 1604 and patterning the gate electrode layer 1604 and the gate dielectric layer 1602 according to the masking layer 1704 by an etch (e.g., wet/dry etch). The etch removes unmasked portions of the gate dielectric layer 1602 and the gate electrode layer 1604. Subsequently, the masking layer 1704 may be stripped or etched away.

Figure 17:
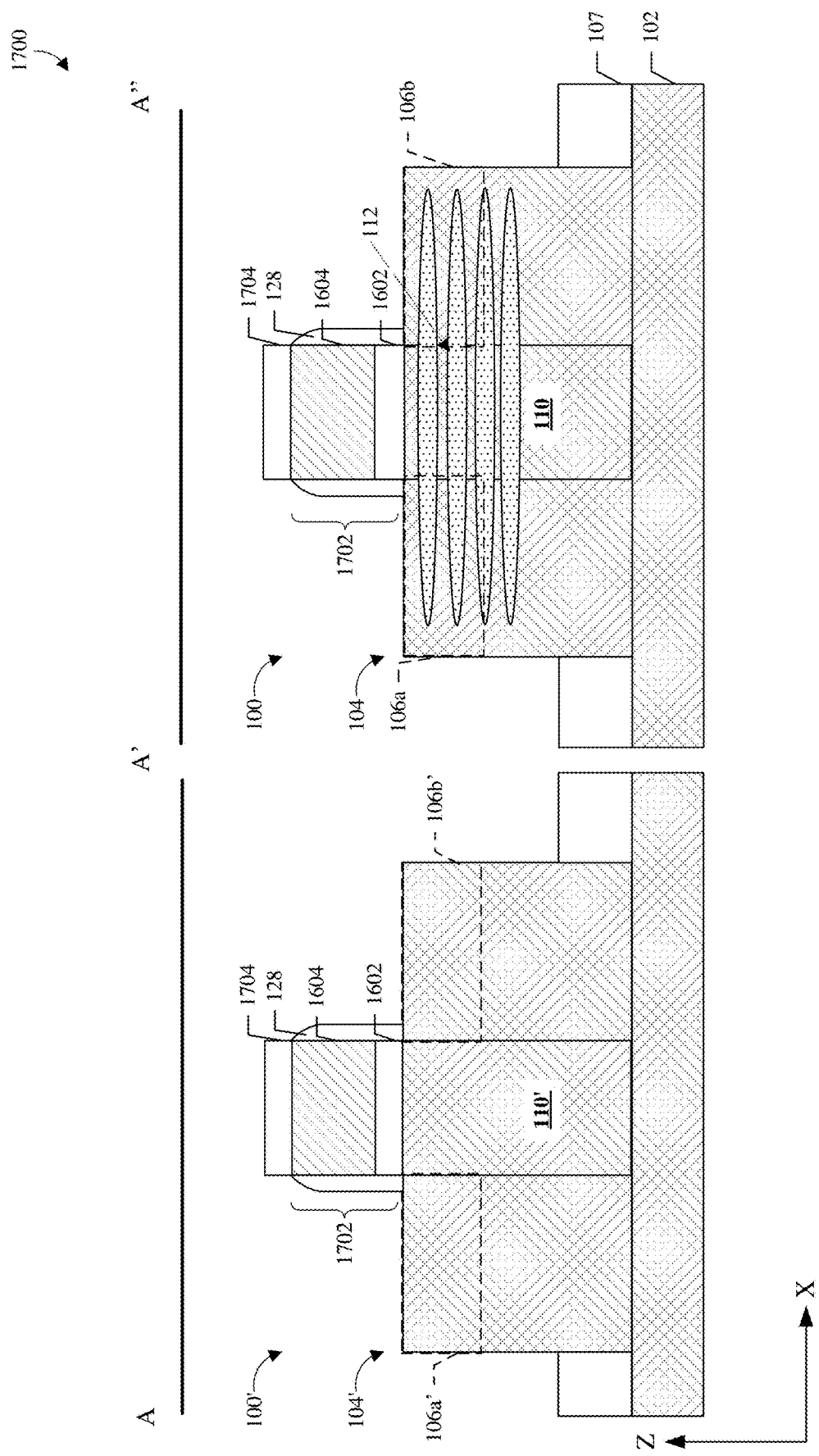

As shown in FIG. 17, dummy source/drain regions 106a/106b of the FinFET MOS capacitor 100 and source/drain regions 106a'/106b' of the FinFET transistor 100' are formed at opposite sides of the fin structures 104, 104'. The source/drain regions 106a/106b, 106a'/106b' may be formed by a series of ion implantation processes to form doping regions. In some embodiments, the dummy source/drain regions 106a/106b and the source/drain regions 106a'/106b' are formed by an ion implantation process and may utilize a masking layer (not shown) to selectively implant ions into the substrate 102. In further embodiments, the initial gate stack 1702 and a sidewall spacer (not shown) may be utilized as the masking layer to form the dummy source/drain regions 106a/106b and the source/drain regions 106a'/106b'. In some embodiments, lightly-doped source/drain extensions (LDDs) may be formed in the substrate 102 on opposite sides of the initial gate stack 1702. In some embodiments, the LDDs are formed by an ion implantation process and may utilize a masking layer (not shown) to selectively implant ions in the fin structures 104, 104'. In further embodiments, the initial gate stack 1702 may be utilized as the masking layer to form the LDDs.

Figure 18:
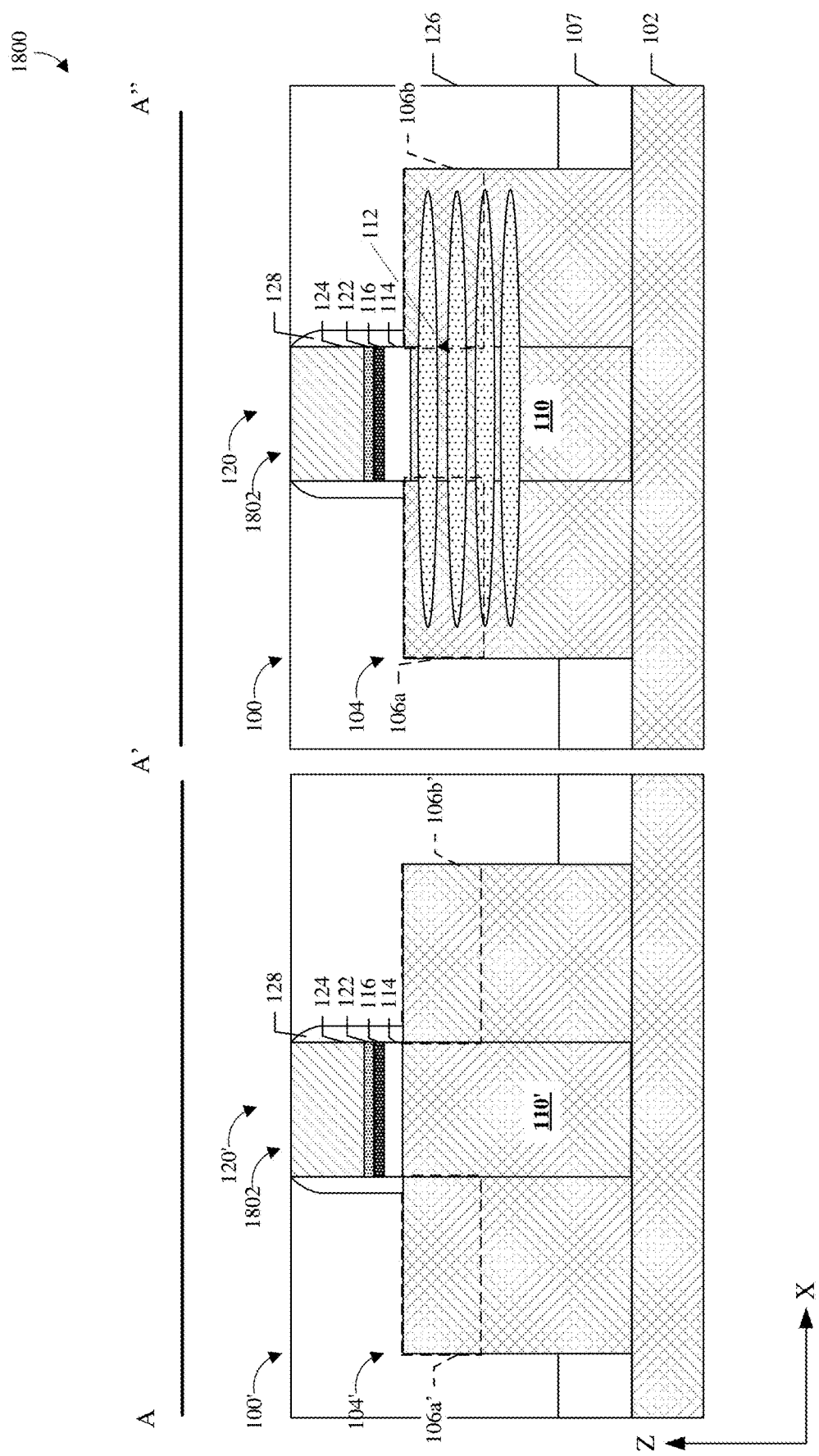
Figure 19:
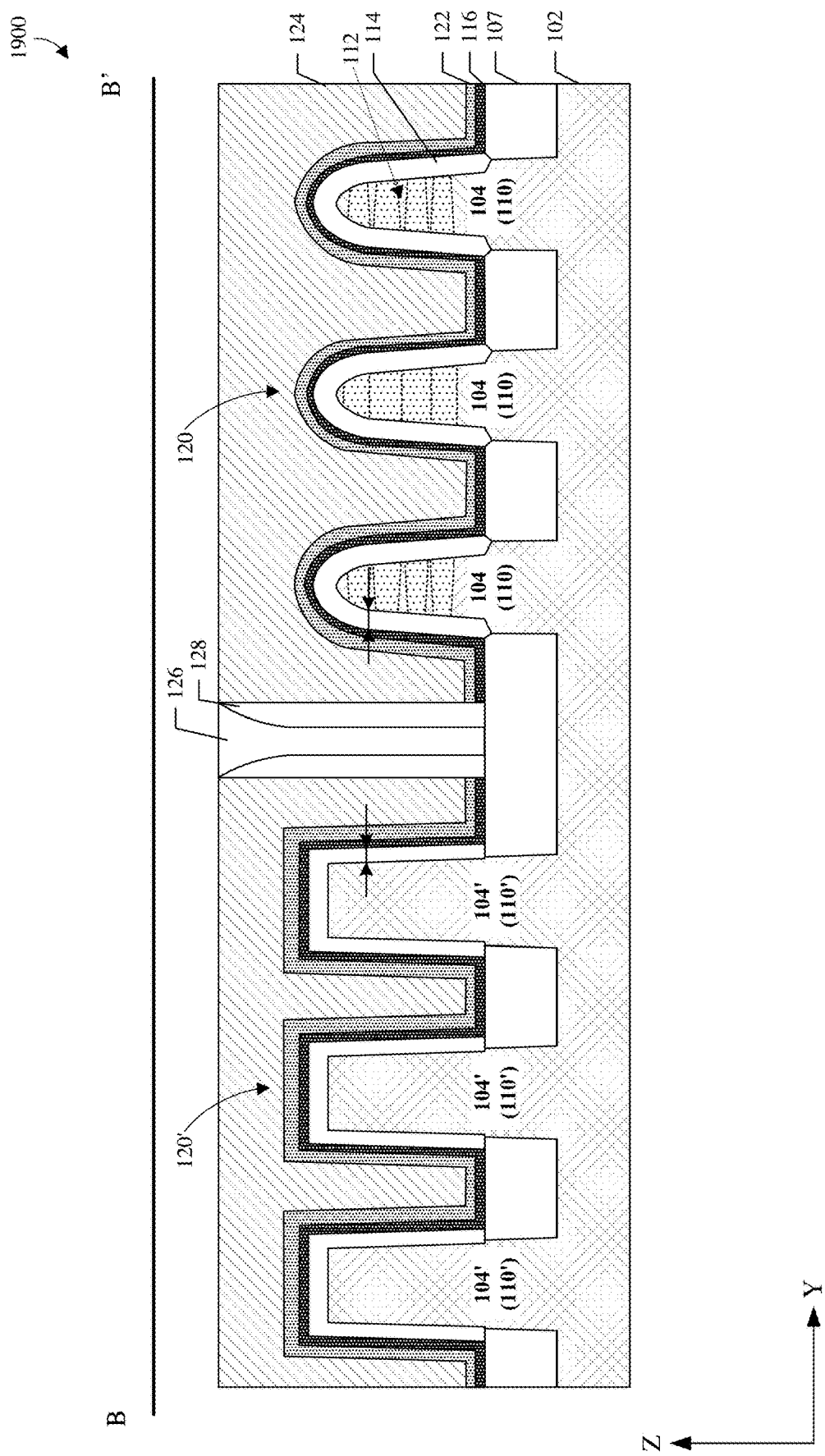

As shown in FIG. 18 and FIG. 19, a replacement gate process may be performed to remove the gate dielectric layer 1602 and a gate electrode layer 1604 and replace with high-k dielectric material and metal gate material. FIG. 18 illustrates a cross-sectional view of some embodiments of the integrated circuit along X-direction, and FIG. 19 illustrates a cross-sectional view of some embodiments along X-direction after the replacement gate process. Firstly, the initial gate stack 1702 is removed to form an opening 1802 (see FIG. 18). As an example, a contact etch stop layer (CESL, not shown) is formed lining previously formed structures, and an interlayer dielectric (ILD) layer 126 is formed on the contact etch stop layer followed by a planarization process to form a planar top surface. The ILD layer may be deposited by CVD, PVD, sputtering, or some other deposition process. The planarization process may be a chemical-mechanical planarization (CMP). Then, the initial gate stack 1702 (see FIG. 17) is removed, thereby forming the opening 1802 that is defined by inner sidewalls of the sidewall spacer 128. In some embodiments, a process for removing the initial gate stack 1702 comprises performing an etch (e.g., dry or wet etch) to selectively remove the initial gate stack 1702. In further embodiments, before the etch, a masking layer (not shown) may be formed covering the ILD layer 126 and the sidewall spacer 128, while leaving the initial gate stack 1702 exposed. Thereafter, the etch is performed with the masking layer in place, thereby selectively removing the initial gate stack 1702. Subsequently, the masking layer may be etched or stripped away.

Then, gate dielectric materials and metal gate materials are filled in the opening 1802 to form a capacitor gate stack 120 and a transistor gate stack 120', which may respectively include an interfacial dielectric layer 114, a high-k dielectric layer 116, a work function metal layer 122, and a bulk metal gate layer 124, for example. In some embodiments, the interfacial dielectric layer 114 may be formed by a thermal process that converts an outermost portion of the dummy channel region 110 and the channel region 110' to the interfacial dielectric layer 114. Since the dummy channel region 110 was doped by the series of ion implantation processes to form the doped region 112 as described in FIG. 13, the dummy channel region 110 of the capacitor fin structures 104 becomes more amorous and may be consumed more compared to the channel region 110' of the transistor fin structures 104'. As a result, the capacitor fin structures 104 may have a more tapered upper portion and a narrower width than the transistor fin structures 104', and the interfacial dielectric layer 114 may have a greater width wrapping around sidewall and top surfaces of the capacitor fin structures 104 than that of the transistor fin structures 104' (See FIG. 19).

The work function metal layer 122 and the bulk metal gate layer 124 may comprise tungsten (W), aluminum (Al), titanium (Ti), molybdenum (Mo), titanium nitride (TiN), tantalum nitride (TaN), or the like. The interfacial dielectric layer 114 may comprise oxide, and the high-k dielectric layer 116 may comprise high-k dielectric materials such as hafnium dioxide (HfO2), zirconium dioxide (ZrO2), or some other dielectric material with a dielectric constant greater than about 3.9. In some embodiments, the capacitor gate stack 120 and the transistor gate stack 120' may be formed by chemical vapor deposition (CVD), physical vapor deposition (PVD), atomic layer deposition (ALD), sputtering, electrochemical plating, electroless plating, or some other deposition process. The process of removing the initial gate stack 1702 and replacing with the high-k dielectric and metal materials as described above may be referred to as a replacement gate process or a gate-last high-k/metal gate (HKMG) process. It will be appreciated that, in some embodiments, the capacitor gate stack 120 and the transistor gate stack 120' may be formed by other processes. For example, the capacitor gate stack 120 and the transistor gate stack 120' may be formed by a gate-first HKMG process (e.g., the metal gate electrode is formed prior to source/drain formation), a fully silicided (FUSI) metal gate process (e.g., fully siliciding a polysilicon gate), or a doped polysilicon gate process (e.g., self-aligned polysilicon gate process). Depending on the process in which the capacitor gate stack 120 and the transistor gate stack 120' is formed, the gate electrode material may comprise, for example, doped polysilicon (e.g., n-type/p-type polysilicon), undoped polysilicon, a metal (e.g., W, Al, Ti, Mo, or the like), a metal-nitride (e.g., TiN, TaN, or the like), some other conductive material, or a combination of the foregoing.

Figure 20:
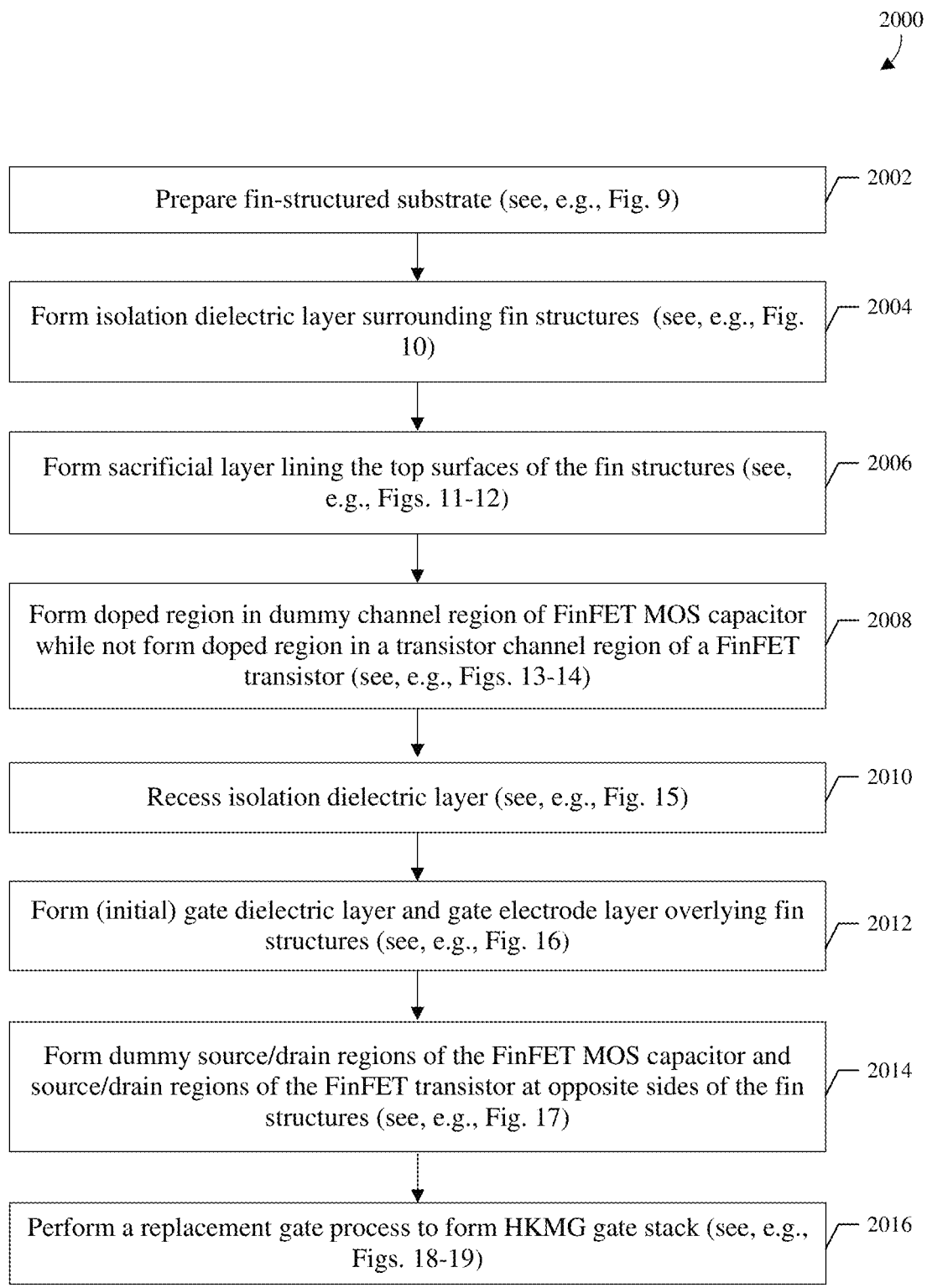
FIG. 20 illustrates a flowchart of some embodiments of a method for forming a FinFET MOS capacitor.

FIG. 20 illustrates a flowchart 2000 of some embodiments of a method for forming an integrated circuit (IC) comprising a FinFET MOS capacitor. The FinFET MOS capacitor may be the FinFET MOS capacitor shown and described above associated with FIGS. 1-19. While the flowchart 2000 of FIG. 20 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At act 2002, a fin-structured substrate is prepared. A hard mask can be patterned and then used to from the fin structures extending upwardly from an upper surface of the substrate. FIG. 9 illustrates a cross-sectional view 900 of some embodiments corresponding to act 2002.

At act 2004, an isolation dielectric layer is formed surrounding the fin structures. The isolation dielectric layer can be formed by a deposition process followed by a planarization process to be co-planar with the hard mask. The isolation dielectric layer is then etched back to a position between top and bottom surfaces of the hard mask. FIG. 10 illustrates a cross-sectional view 1000 of some embodiments corresponding to act 2004.

At act 2006, a sacrificial layer is formed lining the top surfaces of the fin structures. As an example, the sacrificial layer can be formed by a thermal oxidation process such as an in-situ steam generation (ISSG) process. The sacrificial layer may be formed after removing the hard mask from the top surfaces of the fin structures. The hard mask removal process may comprise wet etching processes and/or dry etching processes. FIGS. 11-12 illustrate a series of cross-sectional views 1100-1200 of some embodiments corresponding to act 2006.

At act 2008, a doped region is formed in an upper region of a dummy channel region of a FinFET MOS capacitor. In some embodiments, the doped region is formed with multiple doped layers one vertically stacked next to another. The doped region may be formed by performing a series of angled ion implantation processes first to the capacitor fin structures followed by an annealing process. The annealing process can be performed by a rapid thermal annealing (RTA) method. As a result, the doped region may be formed with a doping concentration greater in an inner region than an outer region of the dummy channel region in lateral directions. A channel region of a FinFET transistor may be covered and protected by a protection layer from the implantation when performing the implantation processes. As a result, the dummy channel region may have a doping concentration greater than that of the channel region. FIGS. 13-14 illustrate a series of cross-sectional views 1300-1400 of some embodiments corresponding to act 2008.

At act 2010, the isolation dielectric layer is etched back to a lower position to expose an upper portion of the fin structures. The sacrificial layer is also removed during this process. FIG. 15 illustrates a cross-sectional view 1500 of some embodiments corresponding to act 2010.

At act 2012, an initial gate stack is formed overlying the fin structures, the initial gate stack comprising a gate dielectric layer and an initial gate electrode layer. The initial gate dielectric layer and the initial gate electrode layer may be formed by a deposition process followed by a patterning process. FIG. 16 illustrates a cross-sectional view 1600 of some embodiments corresponding to act 2012.

At act 2014, dummy source/drain regions of the FinFET MOS capacitor and source/drain regions of the FinFET transistor are formed at opposite sides of the fin structures. The source/drain regions may be formed by a series of ion implantation processes. In some embodiments, lightly-doped source/drain extensions (LDDs) may also be formed on opposite sides of the initial gate stack. FIG. 17 illustrates a cross-sectional view 1700 of some embodiments corresponding to act 2014.

At act 2016, a replacement gate process may be performed to remove the initial gate stack and replace with high-k dielectric material and metal gate material. In some embodiments, the replacement gate process is performed by forming an interlayer dielectric (ILD) layer over the substrate and the initial gate stack. The ILD structure may be then polished to have a top surface coplanar with that of the initial gate stack. Then the initial gate stack is removed leaving an opening in the ILD. The opening is then filled with the high-k dielectric material and metal gate material. FIGS. 18-19 illustrate a series of cross-sectional views 1800-1900 of some embodiments corresponding to act 2016.

In some embodiments, the present application provides a FinFET MOS capacitor. The FinFET MOS capacitor comprises a substrate and a capacitor fin structure extending upwardly from an upper surface of the substrate. The capacitor fin structure comprises a pair of dummy source/drain regions separated by a dummy channel region and a capacitor gate structure straddling on the capacitor fin structure. The capacitor gate structure is separated from the capacitor fin structure by a capacitor gate dielectric.

In some embodiments, the present application provides an integrated circuit (IC). The IC comprises a FinFET MOS capacitor and a FinFET transistor integrated in a substrate. The FinFET MOS capacitor comprises a capacitor fin structure extending upwardly from an upper surface of the substrate and a capacitor gate structure straddling on the capacitor fin structure. The capacitor gate structure is separated from the capacitor fin structure by a capacitor gate dielectric. The FinFET transistor comprises a transistor fin structure extending upwardly from the upper surface of the substrate and a transistor gate structure straddling on the transistor fin structure. The transistor gate structure is separated from the transistor fin structure by a transistor gate dielectric. The capacitor fin structure has a width smaller than that of the transistor fin structure.

In some embodiments, the present application provides a method for forming a FinFET MOS capacitor. In the method, a plurality of fin structures is formed extending upwardly from an upper surface of a substrate. The plurality of fin structures has a capacitor fin structure and a transistor fin structure. Then, a shallow trench isolation (STI) structure is formed between the plurality of fin structures and a sacrificial dielectric layer on top of the plurality of fin structures and the STI structure. Then, a doping process is performed to a dummy channel region of the capacitor fin structure with the transistor fin structure protected from the doping process. Then, the STI structure is recessed to expose an upper portion of the plurality of fin structures. Then a gate dielectric layer is formed covering the top and exposed sidewall surfaces of the plurality of fin structures. Then, a gate electrode layer is formed on the gate dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a FinFET MOS capacitor adjacent to a FinFET transistor, comprising:
    forming a plurality of fin structures having a capacitor fin structure and a transistor fin structure extending upwardly from an upper surface of a substrate;
    forming an isolation dielectric layer to define a shallow trench isolation (STI) structure between the plurality of fin structures and a sacrificial dielectric layer on top of the plurality of fin structures;
    performing a doping process to a dummy channel region of the capacitor fin structure with the transistor fin structure protected from the doping process, wherein the doping process of the dummy channel region of the capacitor fin structure comprises multiple doping steps to form multiple doped layers vertically stacked one over another in a first direction, and wherein the first direction is orthogonal to the upper surface of the substrate, wherein the dummy channel region is a same semiconductor material along an entirety of a first line when viewed from a cross section, and wherein the first line extends from a midpoint of a top doped layer of the multiple doped layers to a midpoint of a bottom doped layer of the multiple doped layers;
    recessing the STI structure to expose an upper portion of the plurality of fin structures;
    forming a gate dielectric layer covering the top and exposed sidewall surfaces of the plurality of fin structures; and
    forming a gate electrode layer on the gate dielectric layer.

2. The method of claim 1, wherein the forming of the gate dielectric layer comprises a thermal oxidation process that forms the gate dielectric layer having a thickness on the capacitor fin structure greater than that on the transistor fin structure, wherein before the thermal oxidation process, an uppermost surface area of the dummy channel region is a same as the uppermost surface area of a channel region in the transistor fin structure, and wherein after the thermal oxidation process, the uppermost surface area of the dummy channel region is less than the uppermost surface area of the channel region in the transistor fin structure.

3. The method of claim 1, wherein an anneal process is performed after performing the doping process and prior to recessing the STI structure.

4. The method of claim 1, further comprising forming dummy source/drain regions, wherein the dummy channel region is doped with the same doping type of the dummy source/drain regions and a doping concentration more than twice greater than that of the dummy source/drain regions.

5. A method of forming a FinFET MOS capacitor adjacent to a FinFET transistor, comprising:
    forming a plurality of fin structures having a capacitor fin structure and a transistor fin structure extending upwardly from an upper surface of a substrate;
    performing a doping process to a dummy channel region of the capacitor fin structure with the transistor fin structure protected from the doping process;
    forming a gate dielectric layer covering a top and exposed sidewall surfaces of the plurality of fin structures,
    forming a gate electrode layer on the gate dielectric layer, wherein the dummy channel region has a lower portion below a bottommost surface of the gate electrode layer that has a width equal to a width of a region of the transistor fin structure below the bottommost surface of the gate electrode layer along a first line parallel to the upper surface of the substrate, and the dummy channel region has an upper portion above the bottommost surface of the gate electrode layer that is more tapered than an upper portion of the transistor fin structure; and
    forming dummy source/drain regions, wherein the dummy channel region is doped with a same doping type of the dummy source/drain regions and a doping concentration more than twice greater than that of the dummy source/drain regions.

6. The method of claim 5, wherein the dummy channel region comprises multiple doped layers one stacked over another vertically.

7. The method of claim 6, wherein the capacitor fin structure has a dummy channel length that is a same as that of the transistor fin structure.

8. The method of claim 5, wherein before forming the gate dielectric layer, the upper portion of the capacitor fin structure has a same taper as the upper portion of the transistor fin structure.

9. The method of claim 5, wherein the doping process of the dummy channel region of the capacitor fin structure comprises multiple doping steps to form multiple doped layers vertically stacked one over another in a first direction, and wherein the first direction is orthogonal to the upper surface of the substrate.

10. A method of forming a FinFET MOS capacitor adjacent to a FinFET transistor, comprising:
    forming a plurality of fin structures having a capacitor fin structure and a transistor fin structure extending upwardly from an upper surface of a substrate, wherein the capacitor fin structure has a same width as the transistor fin structure when measured along a first line extending parallel to the upper surface of the substrate, and wherein the capacitor fin structure has a same height as the transistor fin structure;
    performing a doping process to a dummy channel region of the capacitor fin structure with the transistor fin structure protected from the doping process;
    forming a gate dielectric layer covering a top and exposed sidewall surfaces of the plurality of fin structures, wherein the gate dielectric layer has a first thickness on the capacitor fin structure and a second thickness on the transistor fin structure, wherein the first thickness is greater than the second thickness, wherein after forming the gate dielectric layer, the capacitor fin structure has a width smaller than that of the transistor fin structure when measured along the first line; and
    forming a gate electrode layer on the gate dielectric layer; and
    forming dummy source/drain regions in capacitor fin structure and source/drain regions in the transistor fin structure.

11. The method of claim 10, wherein before forming the gate dielectric layer, the capacitor fin structure has an upper portion with a same taper as an upper portion of the transistor fin structure, and wherein after forming the gate dielectric layer, the upper portion of the capacitor fin structure is more tapered than the upper portion of the transistor fin structure.

12. The method of claim 10, wherein after the doping process, the capacitor fin structure has a same width as the transistor fin structure when measured along the first line.

13. The method of claim 10, wherein the dummy channel region of the capacitor fin structure has a doping concentration more than twice greater than that of a channel region of the transistor fin structure.

14. The method of claim 13, wherein the dummy source/drain regions of the capacitor fin structure have a doping concentration the same with that of the source/drain regions of the transistor fin structure.

15. The method of claim 13, wherein the dummy source/drain regions of the capacitor fin structure are n-type doped.

16. The method of claim 10, wherein the capacitor fin structure comprises a plurality of nanowires one stacked over another and separated by the gate dielectric layer.

17. The method of claim 10, wherein the dummy channel region is heavily doped.

18. The method of claim 10, wherein the dummy channel region is doped with a doping concentration more than twice greater than that of the dummy source/drain regions.

19. The method of claim 10, wherein the FinFET MOS capacitor has a capacitance linearity smaller than 3%.

20. The method of claim 10, wherein the doping process of the dummy channel region of the capacitor fin structure comprises multiple doping steps to form multiple doped layers vertically stacked one over another in a first direction, and wherein the first direction is orthogonal to the upper surface of the substrate.

* * * * *